(12) United States Patent
Mano et al.

(10) Patent No.: US 7,049,746 B2
(45) Date of Patent: May 23, 2006

(54) LIGHT-EMITTING UNIT AND ILLUMINATOR UTILIZING THE SAME

(75) Inventors: Yasuhisa Mano, Kyoto (JP); Toshiyuki Ohnishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 229 days.

(21) Appl. No.: 10/728,617

(22) Filed: Dec. 3, 2003

(65) Prior Publication Data
US 2004/0239242 A1 Dec. 2, 2004

(30) Foreign Application Priority Data
Dec. 26, 2002 (JP) ............... 2002-377744

(51) Int. Cl.
*H01J 1/62* (2006.01)
(52) U.S. Cl. .................. 313/512; 257/98; 257/100; 438/26; 362/240; 362/249; 362/800
(58) Field of Classification Search .......... 313/512, 313/485, 502, 113, 500, 504, 506, 508, 498; 257/98–100, 680; 438/22, 25, 26, 123; 362/240, 362/249, 296, 800
See application file for complete search history.

(56) References Cited

U.S. PATENT DOCUMENTS 5,986,401 A * 11/1999 Thompson et al. ......... 313/504
2003/0141813 A1* 7/2003 Miyashita ................... 313/512

FOREIGN PATENT DOCUMENTS

JP 04-028269 1/1992
JP 07-231120 8/1995

* cited by examiner

*Primary Examiner*—Edward J. Glick
*Assistant Examiner*—Elizabeth Keaney
(74) *Attorney, Agent, or Firm*—Hamre, Schumann, Mueller & Larson, P.C.

(57) ABSTRACT

A light-emitting unit, including LEDs mounted on both sides of a substrate, simulates a spherical light source. The LED on each side of the substrate is enclosed by a lens made of a material containing light-dispersing particles. The substrate is provided with a wiring pattern connected to the LEDs. Each of the light-dispersing lenses has a circular periphery which is adjacent to an edge of the substrate.

22 Claims, 15 Drawing Sheets

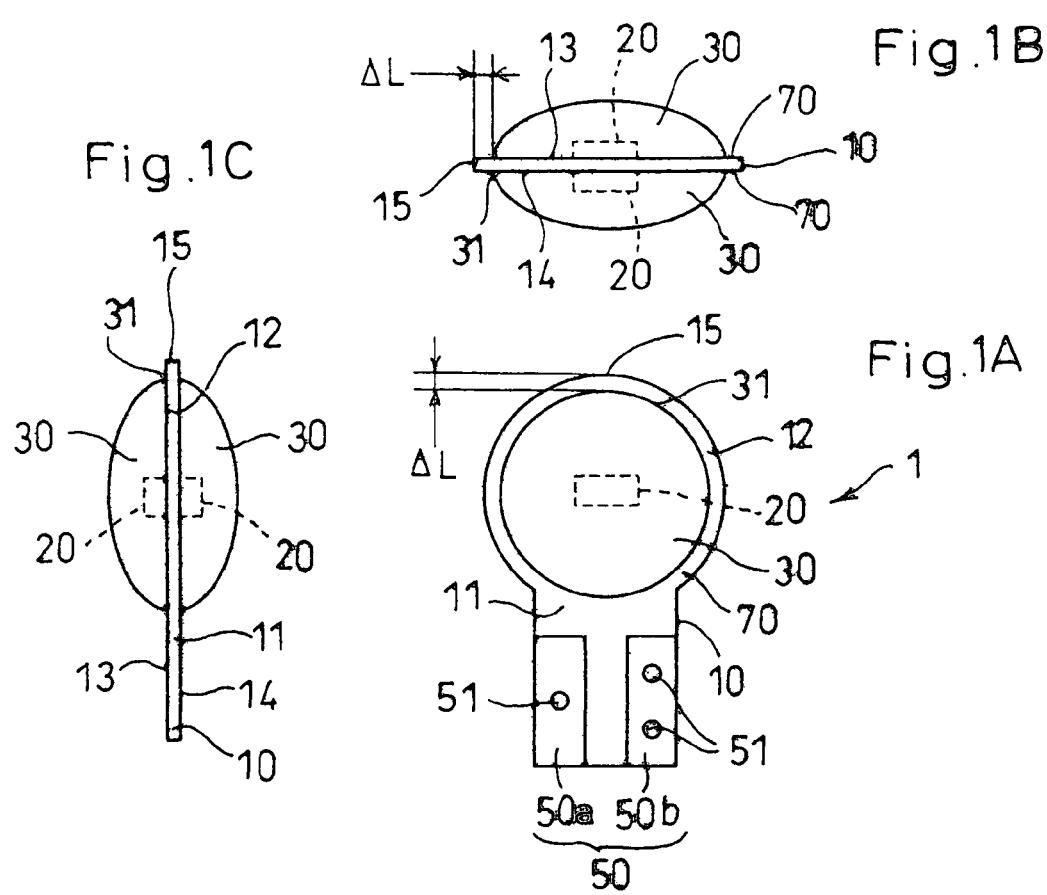
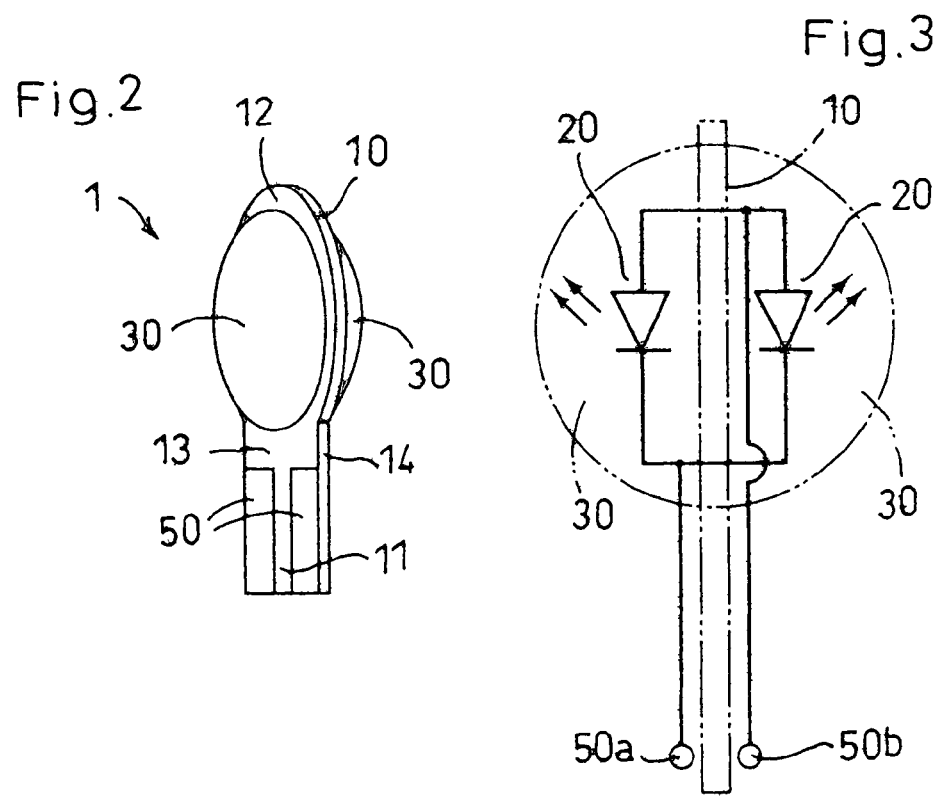

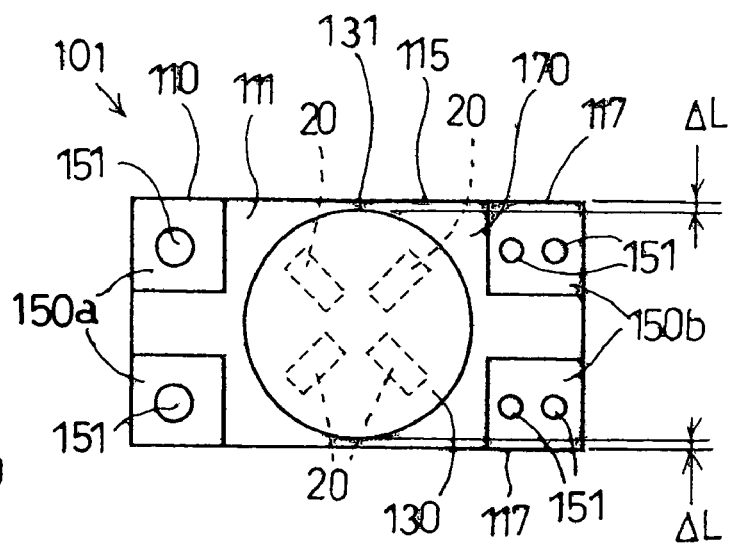
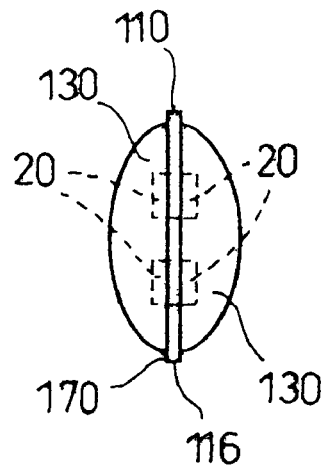
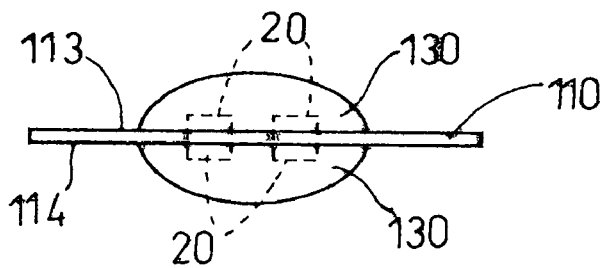
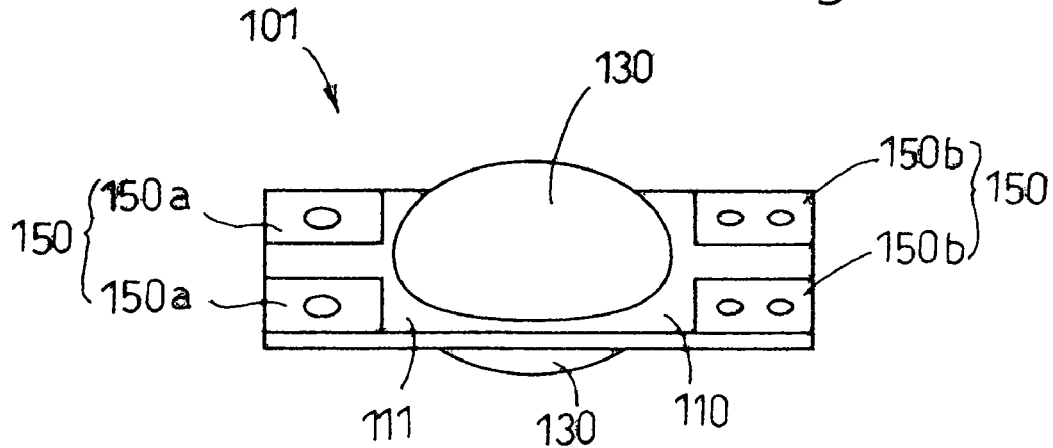

LIGHT-EMITTING UNIT AND ILLUMINATOR UTILIZING THE SAME

BACKGROUND OF THE INVENTION

1. Field of the Invention

The present invention relates to a light-emitting unit, in particular, of the type which includes a printed circuit board or substrate, a light-emitting element mounted on the board, and a lens to interact with light from the light-emitting element. The present invention also relates to an illuminator incorporating such a light-emitting unit as one of the constituent parts.

2. Description of the Related Art

The prior art in the field of electric illuminators teaches that an illuminator is obtained by mounting a light-emitting element on a printed circuit board, and providing a lens to interact with the light emitted from the light-emitting element. With such illuminators, various kinds of techniques have been developed in order to improve the lighting efficiency so that the selected area is irradiated brightly, or to avoid uneven irradiation by adjusting the configuration of the lens. As one possible way to achieve the improvement of the lighting efficiency, the light-emitting element may be surrounded by a highly reflective metal member so that the maximum amount of light from the element is directed toward a convex lens (in this connection, refer to Japanese patent application laid-open No. H04-28269, for example).

For adjustment of the lens configuration, a resin in a liquid state for making the lens is caused to drop into a recess provided on the board supporting the light-emitting element, and then the resin is hardened. In this manner, the height of the lens, for example, can be standardized (in this connection, refer to Japanese patent application laid-open No. H07-231120, for example).

As noted above, the performance of conventional illuminators has been improving. In addition, when a light-emitting diode is employed as the light source, the illuminator consumes a smaller amount of energy and lasts a considerably longer life (the life can be substantially semi-permanent). However, the applicable fields of the conventional illuminators are unduly limited because of their distinct directivity. As an example, supposing that two light-emitting elements are mounted on the board, with one on the obverse side and the other on the reverse side, the illuminator only produces two light beams which may typically travel in the opposite directions. With such an arrangement, it is impossible to realize uniform irradiation in all the directions around the light source.

SUMMARY OF THE INVENTION

The present invention has been proposed under the circumstances described above. It is, therefore, an object of the present invention to provide an all-directional light-emitting unit that can emit light as if a spherical light source is employed.

According to a first aspect of the present invention, there is provided a light-emitting unit comprising: a substrate including an obverse surface and a reverse surface; a first light-emitting element mounted on the obverse surface of the substrate, and a second light-emitting element mounted on the reverse surface of the substrate; a first lens arranged for dispersion of light and enclosing the first light-emitting element, and a second lens arranged for dispersion of light and enclosing the second light-emitting element; and a first wiring pattern formed on the obverse surface of the substrate, and a second wiring pattern formed on the reverse surface of the substrate. Each lens includes a periphery which is "adjacent" to at least a part of an edge of the substrate.

It should be noted that "adjacent" means "being in close proximity" and may or may not imply contact. Thus, in saying that a periphery is adjacent to an edge, it can mean either that "the periphery is close to but spaced apart from the edge" or that "the periphery is held in contact with the edge."

Preferably, the periphery of each lens may be circular, and the edge of the substrate may include an arcuate portion extending along the circular periphery of each lens.

Preferably, the dispersion of light for each lens may be provided by causing each lens to contain light-dispersing particles.

Preferably, the unit of the present invention may further comprise a reflecting layer arranged between each lens and the substrate. The reflecting layer may be formed with an opening in which the substrate is partially exposed. The substrate may be made of a transparent material.

Preferably, the substrate may have a rectangular configuration including a first end and a second end which are spaced apart from each other. The first end may be provided with a first terminal, while the second end with a second terminal. Each light-emitting element and each lens may be disposed in a central region of the substrate between the first terminal and the second terminal.

Preferably, the unit of the present invention may further comprise an additional light-emitting element mounted on the obverse surface of the substrate and enclosed by the first lens. The first light-emitting element and the additional light-emitting element may be energized through different current paths independent of each other.

Preferably, the first light-emitting element and the additional light-emitting element may be connected with opposite polarities.

Preferably, the unit of the present invention may further comprise a black layer covering at least part of the substrate between the periphery of the lens and the edge of the substrate.

Preferably, each light-emitting element may include a supporting base, a light-emitting diode chip mounted on the base, and a transparent resin member enclosing the chip.

Preferably, the base may have an elongated rectangular configuration and a center line that extends longitudinally of the base, where the center line passes through the center of the lens (as viewed in plan).

Preferably, each light-emitting element may include a light-emitting diode chip diebonded to a corresponding one of the wiring patterns, and also include a metal wire connected to the chip.

Preferably, the metal wire may be arranged to extend along a straight line passing through the center of the lens (as viewed in plan).

According to a second aspect of the present invention, there is provided an illuminator comprising: a substrate including an obverse surface and a reverse surface; a first light-emitting element mounted on the obverse surface of the substrate, and a second light-emitting element mounted on the reverse surface of the substrate; a first lens arranged for dispersion of light and enclosing the first light-emitting element, and a second lens arranged for dispersion of light and enclosing the second light-emitting element; a first wiring pattern formed on the obverse surface of the substrate, and a second wiring pattern formed on the reverse surface of the substrate; a base connected to the wiring patterns; and an envelope for accommodating the substrate, the light-emitting elements, the lenses and the wiring patterns. Each lens may have a periphery which is adjacent to at least a part of an edge of the substrate.

Preferably, the periphery of each lens may be circular, and the edge of the substrate may include an arcuate portion extending along the circular periphery of each lens.

Preferably, the illuminator of the present invention may further comprise an additional light-emitting element mounted on the obverse surface of the substrate and enclosed by the first lens. The first light-emitting element and the additional light-emitting element may be energized through different current paths independent of each other.

Preferably, the first light-emitting element and the additional light-emitting element may be connected with opposite polarities.

Preferably, the illuminator of the present invention may further comprise a black layer covering at least part of the substrate between the periphery of the lens and the edge of the substrate.

Preferably, each light-emitting element may include a supporting base, a light-emitting diode chip mounted on the supporting base, and a transparent resin member enclosing the chip.

Preferably, the supporting base may have an elongated rectangular configuration and a center line that extends longitudinally of the supporting base, wherein the center line passes through the center of the lens (as viewed in plan).

Preferably, each light-emitting element may include a light-emitting diode chip diebonded to a corresponding one of the wiring patterns, and also include a metal wire connected to the chip.

Other features and advantages of the present invention will become apparent from the detailed description given below with reference to the accompanying drawings.

BRIEF DESCRIPTION OF THE DRAWINGS

FIG. 1A is a front view showing a light-emitting unit according to a first embodiment of the present invention;

FIG. 1B is a plan view showing the light-emitting unit of FIG. 1A;

FIG. 1C is a side view showing the light-emitting unit of FIG. 1A;

FIG. 2 is a perspective view showing the light-emitting unit of the first embodiment;

FIG. 3 is a circuit diagram of the light-emitting unit of the first embodiment;

FIG. 14A is a front view showing a light-emitting unit according to a second embodiment of the present invention;

FIG. 14B is a plan view showing the light-emitting unit of the second embodiment;

FIG. 14C is a side view showing the light-emitting unit of the second embodiment;

FIG. 15 is a perspective view showing the light-emitting unit of the second embodiment;

DETAILED DESCRIPTION OF THE PREFERRED EMBODIMENTS

Figure 4:
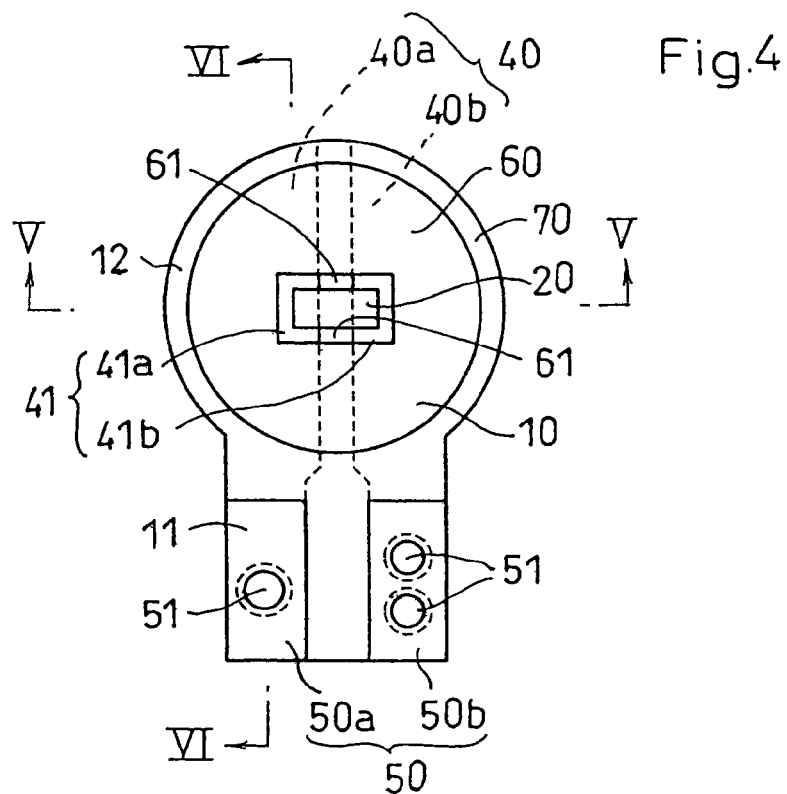
FIG. 4 is a front view showing the light-emitting unit of the first embodiment, with the lens removed.
Figure 5:
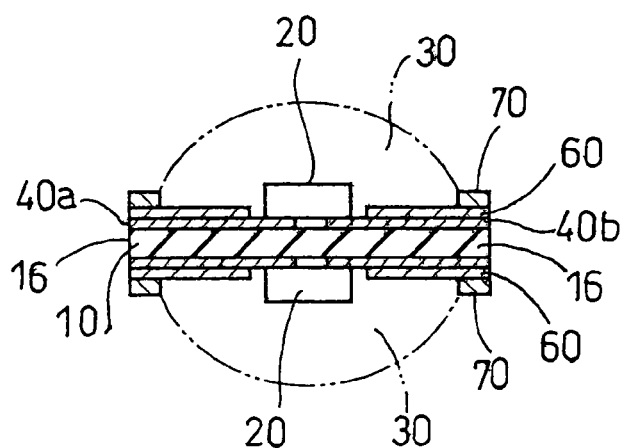
FIG. 5 is a sectional view taken along lines V—V in FIG. 4.
Figure 6:
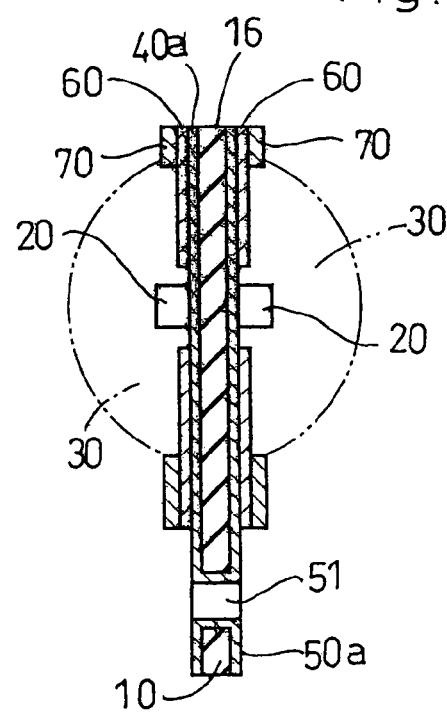
FIG. 6 is a sectional view taken along lines VI—VI in FIG. 4.

Preferred embodiments of the present invention will be described below with reference to the accompanying drawings.

Reference is first made to FIGS. 1–6 illustrating a light-emitting unit 1 according to a first embodiment of the present invention. In the illustrated example, the unit 1 includes a transparent substrate 10, packaged light-emitting elements 20, lenses 30 with light-dispersing properties, and wiring patterns 40 formed on the substrate 10. The substrate 10 has an obverse surface 13 and a reverse surface 14, as shown in FIGS. 1B and 1C, for example. Each surface is provided with a light-emitting element 20, a lens 30 and a wiring pattern 40. The lens 30 has a circular periphery 31. According to the present invention, the periphery 31 may be arranged to overlap with the circular edge of the substrate 10 or retreat slightly inward from the edge of the substrate 10. In the illustrated example, the latter case is depicted, in which the periphery 31 is spaced apart from the circular edge of the substrate 10.

The substrate 10 is formed of a transparent material such as glass-reinforced epoxy, and includes a rectangular portion 11 and a circular portion 12 continuous with the rectangular portion. A light-emitting element 20 is disposed at the center of the circular portion 12 on each side of the substrate 10, with the element 20 covered by a lens 30. The rectangular portion 11 is provided, on each side, with a conductive pattern 50 consisting of a positive electrode 50a and a negative electrode 50b. As shown in FIG. 1A, the substrate 10 is formed with through-holes 51 for connecting the positive electrode 50a on the obverse surface 13 to the counterpart electrode on the reverse surface 14, and for connecting the negative electrode 50b on the obverse surface 13 to the counterpart electrode on the reverse surface 14. On each side of the substrate 10, the positive electrode 50a is connected to a positive conductor 40a, while the negative electrode 50b is connected to a negative conductor 40b (see FIGS. 4–6, for example). As seen from the circuit diagram shown in FIG. 3, the obverse and the reverse light-emitting elements 20 are energized and de-energized simultaneously.

The lens 30 is formed of a transparent resin containing light-dispersing particles for realizing the desired dispersion of light. To make the lens 30, the particle-containing resin in a liquid state is dropped onto the light-emitting element 20 on the substrate 10 so that the element 20 is located at the center of the expanding resin pool. To dam the supplied resin, the circular portion 12 of the substrate 10 is provided with a circular enclosure (to be described later) which is concentric with the portion 12. After the required amount of resin has been poured, the liquid resin is formed into a transparent hemisphere or dome, as shown in FIG. 1C, due to the surface tension. In this state, the supplied resin is hardened to provide the lens 30, with the light-emitting element 20 enclosed therein. With such an arrangement, the light emitted from the element 20 is dispersed by the particles contained in the lens material, thereby leaving the lens 30 with substantially equal luminance at any point in the hemispherical lens surface. Obviously, this holds for the other light-emitting element 20 mounted on the opposite side of the substrate 10.

As shown in FIGS. 1B and 1C, the substrate 10 intervenes between the obverse lens 30 and the reverse lens 30. According to the present invention, however, the distance $\Delta L$ between the lens periphery 31 and the substrate edge 15 is very small or substantially zero, in other words, the periphery 31 is adjacent to the edge 15. In this manner, it is possible to minimize the interference between the light emitted from each element 20 and the circular portion 12 of the substrate 10. As a result, the luminance at the boundary between the obverse and the reverse light hemispheres can be substantially equal to the luminance at any other point in the hemispherical surface. This means that the light-emitting unit 1 of the present invention can simulates a spherical light source designed to emit light in all directions.

According to the present invention, a light reflecting layer (reflector) 60 may be formed on the substrate 10 at a position correspond to the lens 30. With this, stray light emitted from the element 20 is reflected toward the lens surface, which contributes to the increase in luminance.

As seen from FIG. 4, the circular portion 12 of the substrate 10 has a region 61 which is not covered by the reflector 60. Since the substrate 10 as a whole is transparent, the region 61 allows the light from the element 20 to pass through. The light emitted from the element 20 and entering the region 61 can propagate through the inside of the circular portion 12 and go outside via the curved side surface 16 (see FIGS. 5 and 6, for example). This feature also helps the light-emitting unit 1 to function as an all-direction lighting device, since the luminance, as viewed in the thickness direction (as in FIG. 1B or 1C, for example), can be substantially equalized around the unit 1.

Preferably, the substrate 10 may be painted black in portions that are not covered by the lenses 30, so that light striking on these portions are absorbed. With this arrangement, it is possible to prevent light reflection on these portions, whereby the light-emitting unit 1 can serve as a more complete spherical illuminator.

Referring now to FIGS. 1, 4 and 7–9, the manufacturing process of the light-emitting unit 1 will be described below. It should be appreciated that though the focus of the following description is put on the obverse side of the unit 1, the same or similar process is performed, simultaneously or nonsimultaneously, with respect to the reverse side of the unit 1.

Figure 7:
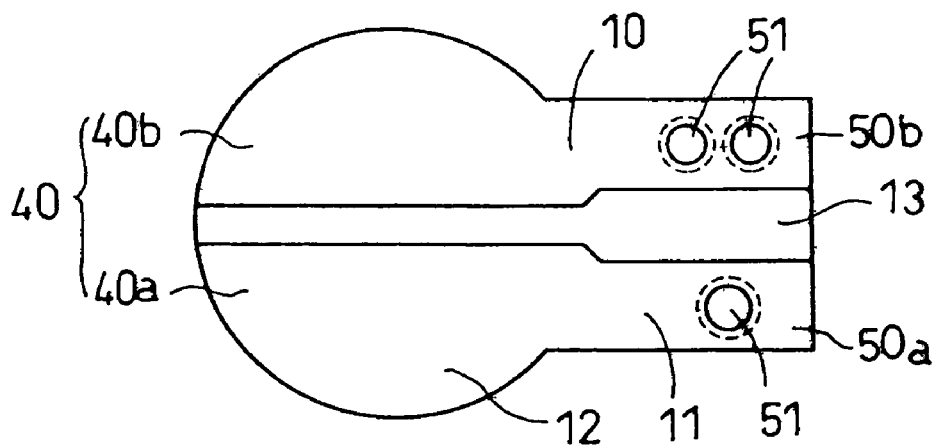
FIG. 7 is a front view showing a substrate used for making the light-emitting unit of the first embodiment, with a wiring pattern formed on the substrate.

First, as shown in FIG. 7, a wiring pattern is formed on the obverse surface 13 of the substrate 10. The illustrated wiring pattern consists of: a positive conductor 40a and a negative conductor 40b spaced apart from each other on the circular portion 12 of the substrate; and a positive electrode 50a and a negative electrode 50b spaced apart from each other on the rectangular portion 11 of the substrate. This wiring pattern may have a two-layer structure consisting of a lower layer made by Cu— or Ni-plating and an upper layer made by Au-plating on the lower layer. The rectangular portion 11 of the substrate is formed with through-holes 51 for interconnecting the obverse and the reverse electrodes 50a, 50b. To this end, the inner wall surface of each through-hole 51 is coated with a conductive layer. In the illustrated example, one through-hole 51 is formed on the side of the positive electrode 50a, whereas two through-holes 51 are formed on the side of the negative electrode 50b. Such an arrangement is advantageous in that the positive and negative electrodes 50a, 50b can easily be distinguished from each other. As readily understood, the illustrated arrangement of the through-holes is only an example and the present invention is not limited to this. For instance, the two through-holes may be formed on the anode side, whereas the single through-hole may be formed on the cathode side. As another example, a single through-hole may be formed on the anode or cathode side, while no through-hole may be formed on the other side.

Figure 8:
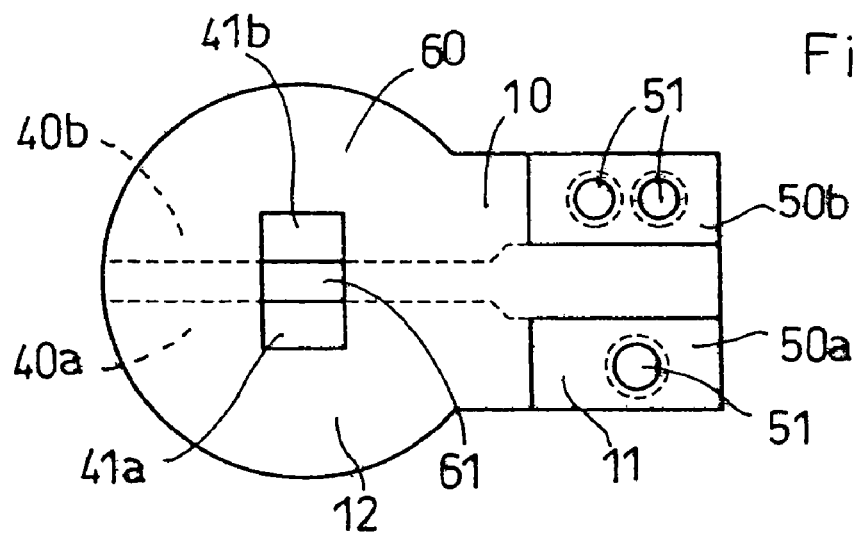
FIG. 8 is a front view showing the substrate used for making the light-emitting unit of the first embodiment, further with a reflecting layer formed on the substrate.

Then, as shown in FIG. 8, a white reflecting layer 60 (reflector, for short) is formed on the circular portion 12, extending onto only a part of the rectangular portion 11 of the substrate 10 so that the electrodes 50a, 50b remain exposed. The reflector 60 is formed with an opening corresponding in position to the center of the circular portion 12 of the substrate 10. With such an opening formed, the positive conductor 40a has an exposed portion serving as an anode 41a, and likewise the negative conductor 40b has an exposed portion serving as a cathode 41b. Between the anode 41a and the cathode 41b, a portion of the substrate 10 is exposed.

Figure 9:
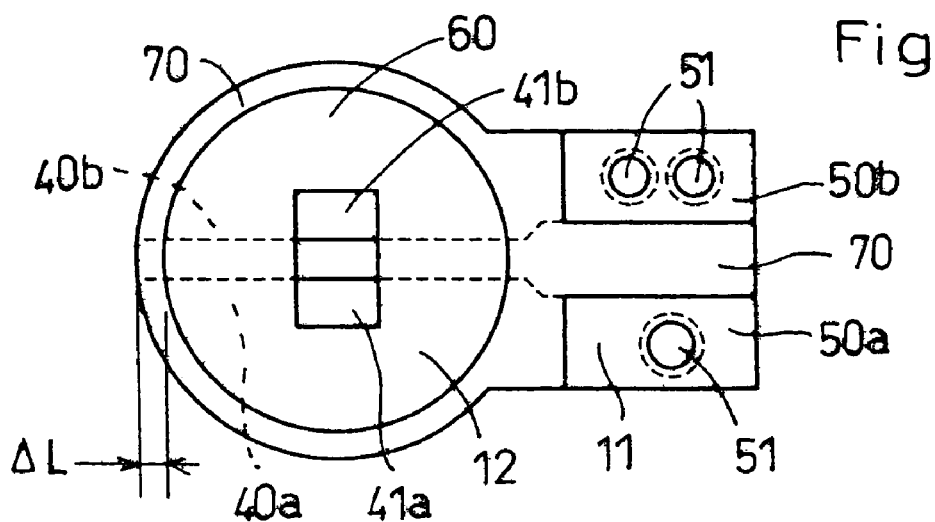
FIG. 9 a front view showing the substrate used for making the light-emitting unit of the first embodiment, further with a black light-shielding layer formed on the substrate.

Then, as shown in FIG. 9, a black light-shielding or light-absorbing layer 70 is formed on the reflector 60 and on the intermediate region between the exposed electrodes 50a and 50b. Though disposed on the reflector 60, the shielding layer 70 allows most part of the reflector 60 to be exposed since a relatively large, circular opening is formed above the circular portion 12 of the substrate. The circular opening of the layer 70 is concentric with the circular portion 12 of the substrate 10. The shielding layer 70, and hence its ringed frame defining the circular opening, has a thickness so great that the supplied molten resin to make the lens 30 is held in the circular opening. The ringed frame of the layer 70 has a constant width $\Delta L$, except for the enlarged part extending onto the rectangular portion 11 of the substrate 10.

Then, as shown in FIG. 4, a light-emitting element 20 is mounted onto the center of the circular portion 12 of the substrate 10 so as to be electrically connected to the anode 41a and the cathode 41b.

Then, a liquid resin material is dropped into the circular opening of the shielding layer 70 so as to allow the supplied resin to form a liquid dome on the circular portion 11 of the substrate 10. After the desired configuration is obtained, the resin material is hardened by exposure to an ultra-violet ray, for example, to produce a solid, hemispherical lens 30. In this manner, the light-emitting unit 1 of the first embodiment is obtained.

Figure 10:
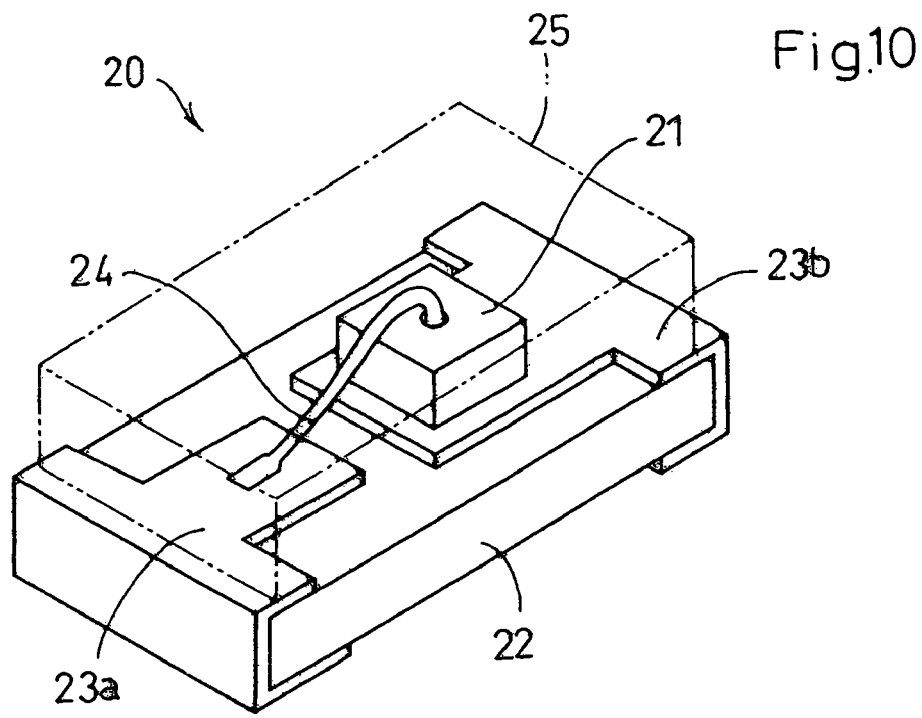
FIG. 10 is a perspective view showing a packaged light-emitting element used for making the light-emitting unit of the first embodiment.

The details of the light-emitting element 20 are shown in FIG. 10. Specifically, the element 20 includes an elongated rectangular base 22 provided with an anode 23a at one end and a cathode 23b at the other end. A light-emitting diode chip 21 is diebonded to the cathode 23b, while also being connected to the anode 23a via a metal wire 24. The diode chip 21 and the associated parts or portions are covered with a transparent resin package 25, which also has an elongated rectangular configuration. In the above-described fabrication process of the unit 1, the anode 23a of the element 20 is connected to the anode 41a on the circular portion 12 of the substrate, while the cathode 23b of the element 20 is connected to the cathode 41b on the circular portion 12 of the substrate.

Figure 11:
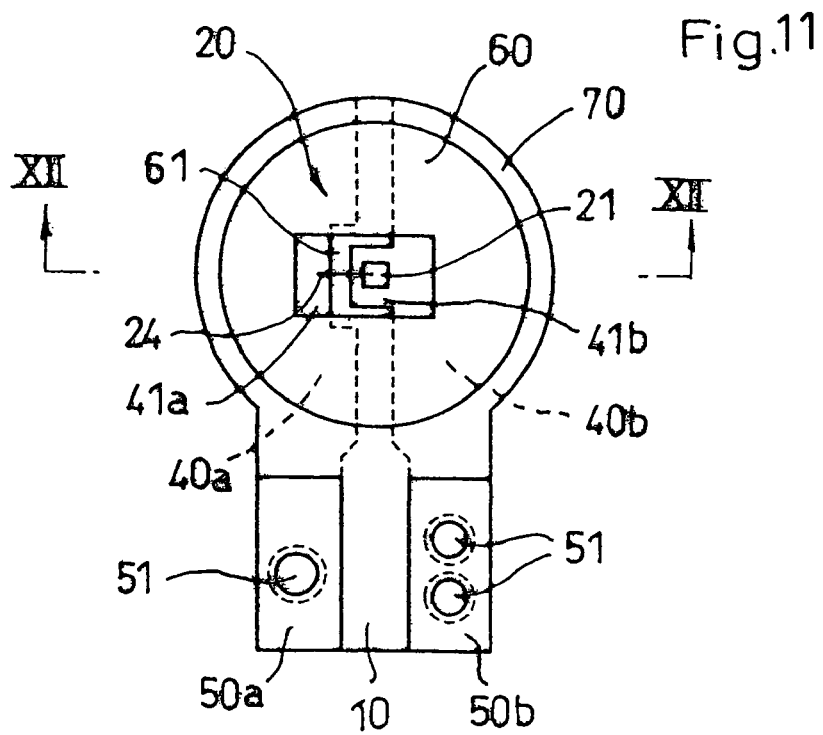
FIG. 11 is a front view showing a bare LED chip mounted on the wiring pattern formed on the substrate.
Figure 12:
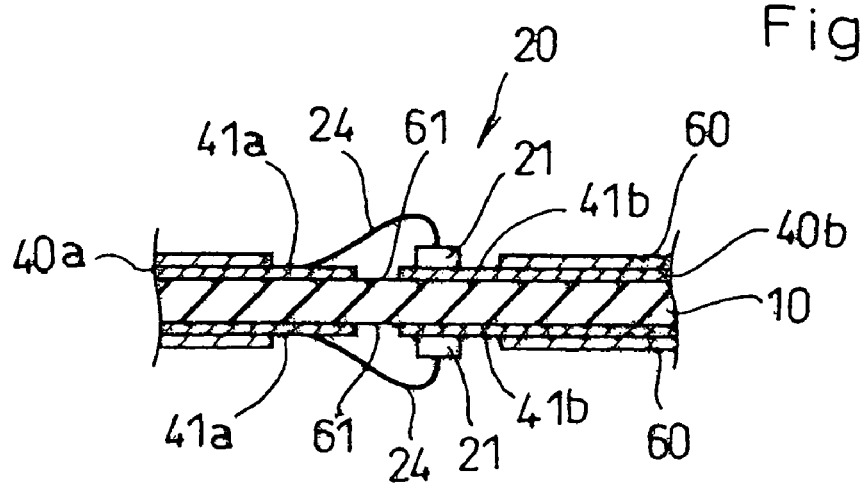
FIG. 12 is a sectional view taken along lines XII—XII in FIG. 11.

According to the present invention, the packaged element 20 may be replaced by a non-packaged light-emitting element 20' shown in FIGS. 11 and 12. In this case, a light-emitting diode chip 21 is directly diebonded to the cathode 41b on the substrate 10. The chip 21 is also connected to the anode 41a via a metal wire 24. In making the lens 30, a molten resin is dropped onto the exposed chip 21 and wire 24.

For color adjustment of the emitted light, the lens 30 and/or the reflector 60 may be pigmented, as required. Alternatively, use may be made of a light-emitting diode chip the light frequency of which corresponds to the desired color. For improvement of the light-dispersion effect, some irregularities may be given to the surface of the lens 30.

To produce white light, each side of the substrate 10 may be provided with three kinds of light-emitting elements designed to emit red, green and blue lights, respectively, to be combined into the desired white light. As another possible way, a fluorescent material may be added to the transparent resin for making the lens 30. In this case, as propagating through the lens 30, the light ("original light") emitted from the element 20 excites the fluorescent additives, and these additives will emit light ("secondary light") as returning to a less excited state. In this case, the original light and the secondary light are blended to produce white light. A suitable fluorescent material is selected in accordance with the frequency of light emitted from the element 20.

Figure 13:
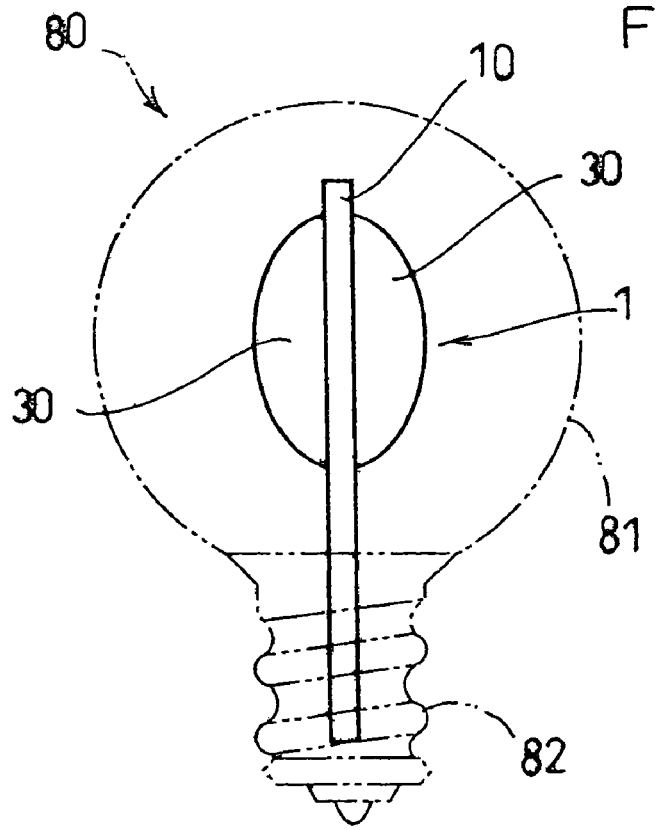
FIG. 13 is a side view showing an illuminator incorporating the light-emitting unit of the first embodiment.

The light-emitting unit 1 of the first embodiment, capable of functioning as a spherical light source, may be utilized for producing an illuminator 80 shown in FIG. 13. In the illuminator 80, the light-emitting unit 1 is accommodated in an envelope 81 made of glass, for example. The unit 1 is electrically connected to a conductive base or cap 82. As in a conventional light bulb, the base 82 may consist of two electrically insulated contacts, a threaded ring contact and a tip contact disposed at the bottom of the base 82. The ring contact is connected to one of the electrodes 50a, 50b, while the tip contact is connected to the other.

Reference is now made to FIGS. 14–25 illustrating a second embodiment of the present invention.

A light-emitting unit 101 of the second embodiment includes a rectangular substrate 110 having an obverse surface 113 and a reverse surface 114 (see FIG. 14B, for example). Each side of the substrate 110 is provided with a domed lens 130 enclosing a plurality of packaged light-emitting elements 20. In the illustrated example, four elements 20 are provided for each lens 130, though the present invention is not limited to this.

Differing from the counterpart of the first embodiment, the substrate 110 of the second embodiment has a rectangular body 111, with no circular portion attached to the rectangular body 111. As shown in FIG. 14A, the diameter of the lens 130 is substantially the same as (or slightly smaller than) the width of the laterally elongated substrate 110. The lens 130 is disposed at the center of the substrate 110, as viewed in the longitudinal direction of the substrate. At its both ends, the substrate 110 is provided with terminals 150. Specifically, these terminals consist of two anodes 150a at one end (the left end in FIG. 14A) and two cathodes 150b at the other end. Each light-emitting element 20 has the previously described structure shown in FIG. 10. The four light-emitting elements 20 are radially arranged on the obverse surface (and the reverse surface) of the substrate 110, with the longitudinal direction of each element 20 aligned with a radial direction of the layout. More specifically, referring to FIG. 16, the rectangular configuration of each element 20 has an imaginary center line (not shown) extending longitudinally of its body (including the base 22 and the package 25, as shown in FIG. 10). According to the illustrated embodiment, this imaginary line extends through the center of the lens 130 to be made.

With the above arrangement, liquid resin supplied for making the lens 130 will flow uniformly in all directions, from the center of the substrate 110 toward any one of the points on the periphery of the prescribed circle defined by the circular opening of a black light-shielding or light-absorbing layer 170. Accordingly, the resulting dome of liquid resin will not suffer a deviation from the prescribed configuration of the original design, the deviation which otherwise would occur due to the blocking of the supplied resin by the disorganized arrangement of the light-emitting elements 20.

Reference is now made to FIGS. 16 and 19–21 illustrating the process of making the light-emitting unit 101 of the second embodiment.

Figure 19:
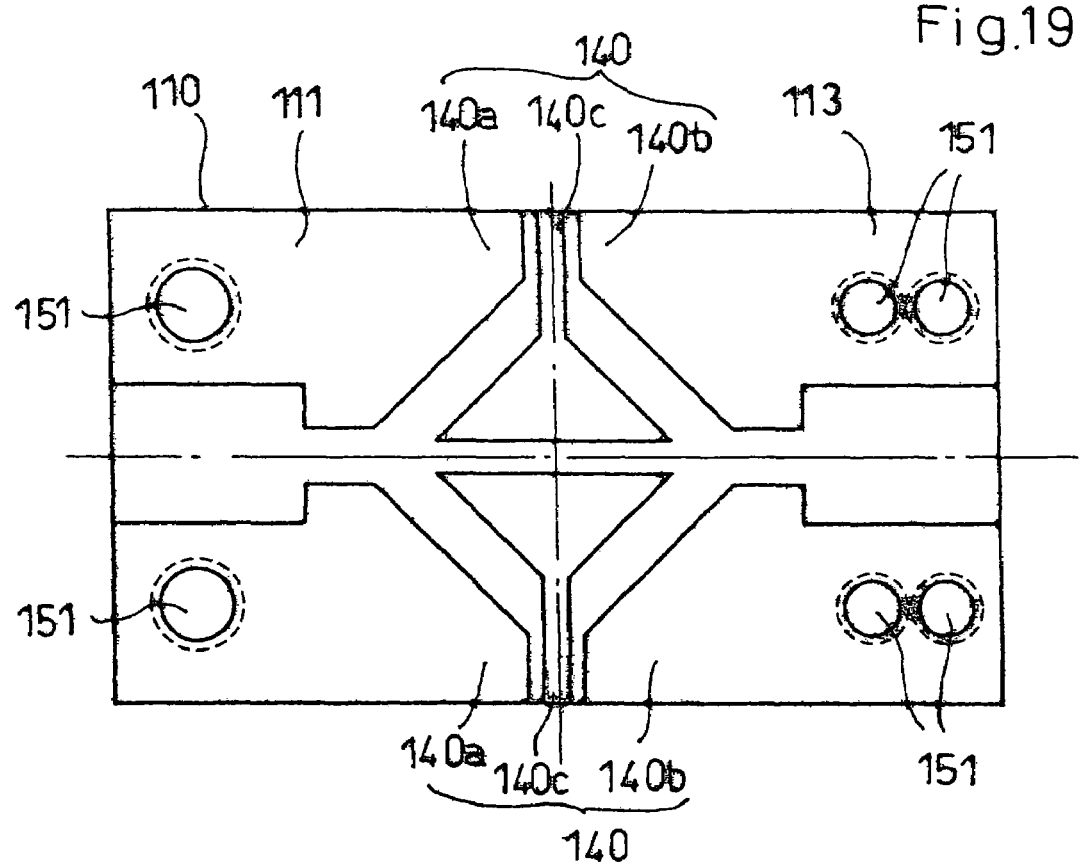
FIG. 19 is a front view showing an substrate used for making the light-emitting unit of the second embodiment, with a wiring pattern formed on the substrate.

First, as shown in FIG. 19, a wiring pattern 140 is formed on the obverse surface 113 of the substrate 110. The illustrated pattern 140 includes six separate conductive parts: two positive conductors 140a, two negative conductors 140b and two intermediate conductors 140c.

Figure 20:
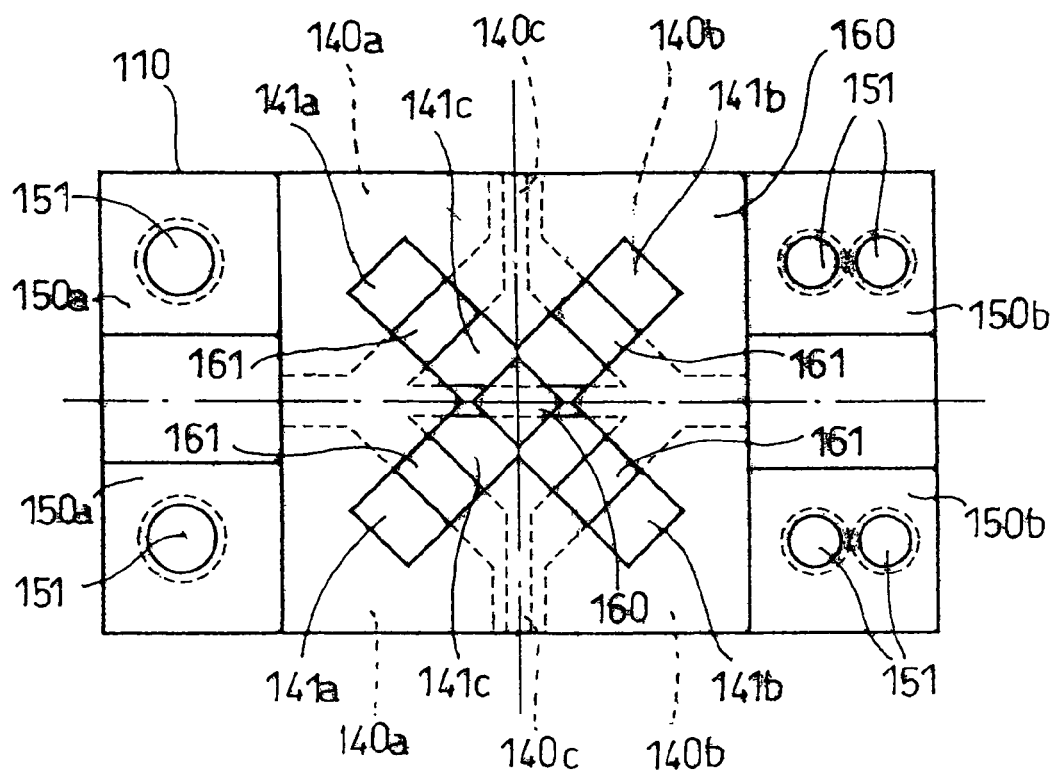
FIG. 20 is a front view showing the substrate used for making the light-emitting unit of the second embodiment, further with a reflecting layer formed on the substrate.

Then, as shown in FIG. 20, a reflecting layer (reflector) 160 is formed on part of the wiring pattern 140. The reflector 160 consists of a rectangular main portion (depicted as substantially square in FIG. 20) and a separate square portion disposed at the center of the cruciform opening formed in the main portion. With this arrangement, the above-mentioned conductors 140a, 140b and 140c are partially exposed in the cruciform opening, thereby providing two anodes 141a, two cathodes 141b and two intermediate connectors 141c. Further, in the cruciform opening, the substrate 110 is partially exposed (see reference numeral 161). As in the first embodiment, light from the light-emitting element can enter the transparent substrate 110 via the exposed parts 161, propagate therethrough, and go out from the side surfaces 116 (see FIG. 18). The reflector 160 does not extend onto the two opposite ends of the substrate 110, thereby allowing part of the positive and the negative conductors 140a, 140b to be exposed. The exposed parts of the positive conductors 140a serve as an anode 150a (on the left side, in FIG. 20), while the exposed parts of the negative conductors 140b serve as a cathode 150b (on the right side, in FIG. 20).

Figure 21:
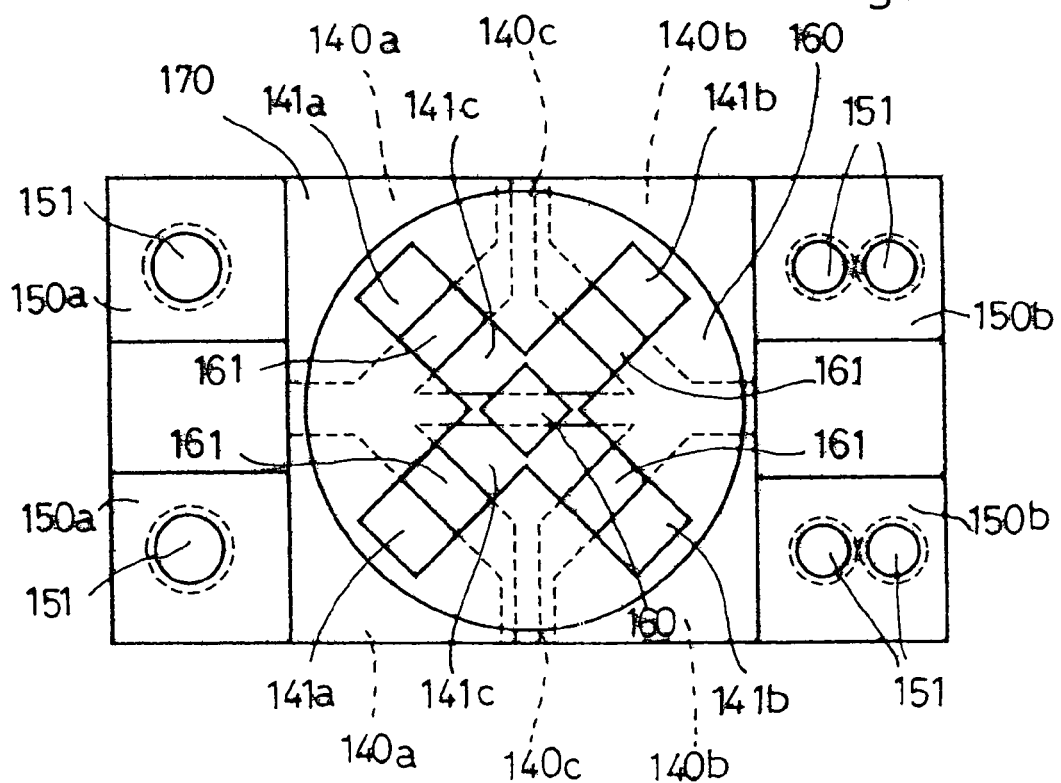
FIG. 21 is a front view showing the substrate used for making the light-emitting unit of the second embodiment, further with a black light-shielding layer formed on the substrate.

Then, as shown in FIG. 21, a black light-shielding or light-absorbing layer 170 is formed on the reflector 160. The shielding layer 170 is formed with a circular opening in which a lens 130 will be produced later.

Figure 16:
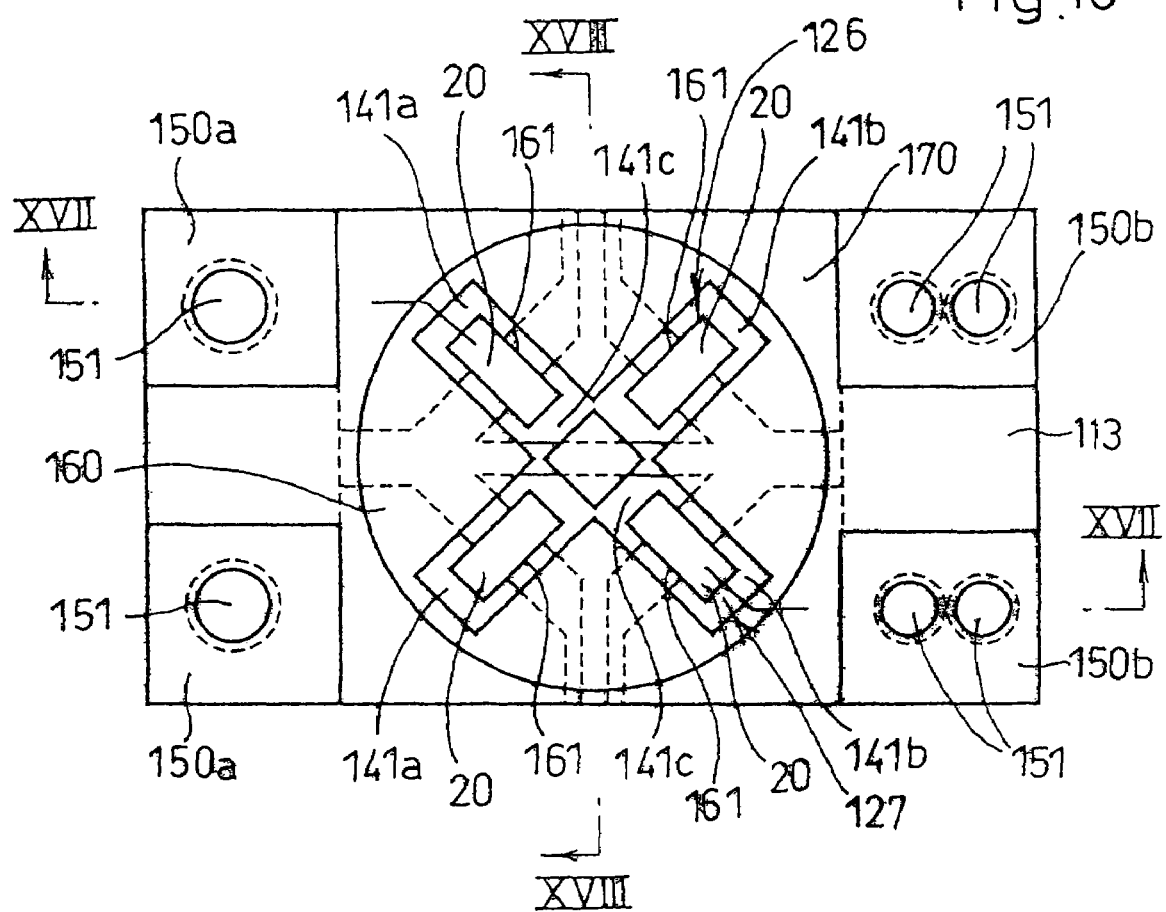
FIG. 16 is a front view showing the light-emitting unit of the second embodiment, with the lens removed.
Figure 17:
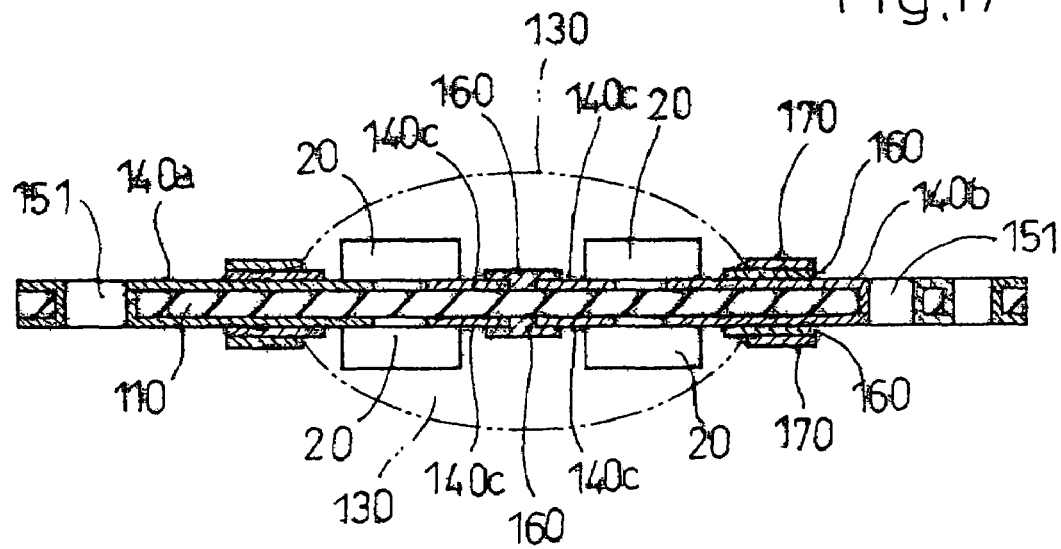
FIG. 17 is a sectional view taken along lines XVII—XVII in FIG. 16.
Figure 18:
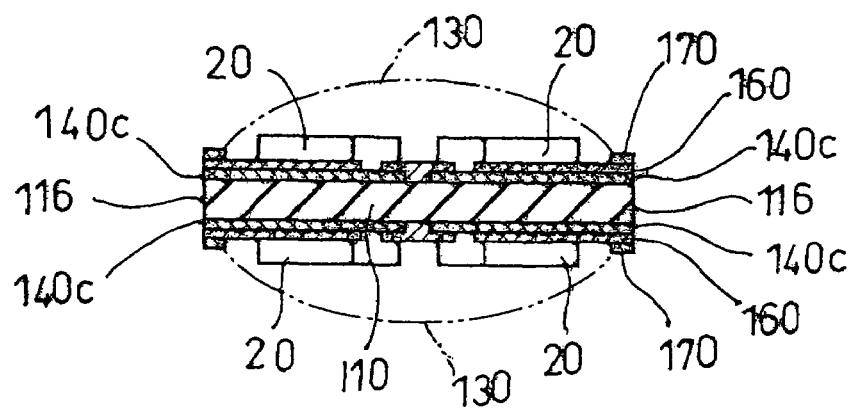
FIG. 18 is a sectional view taken along lines XVIII—XVIII in FIG. 16.
Figure 22:
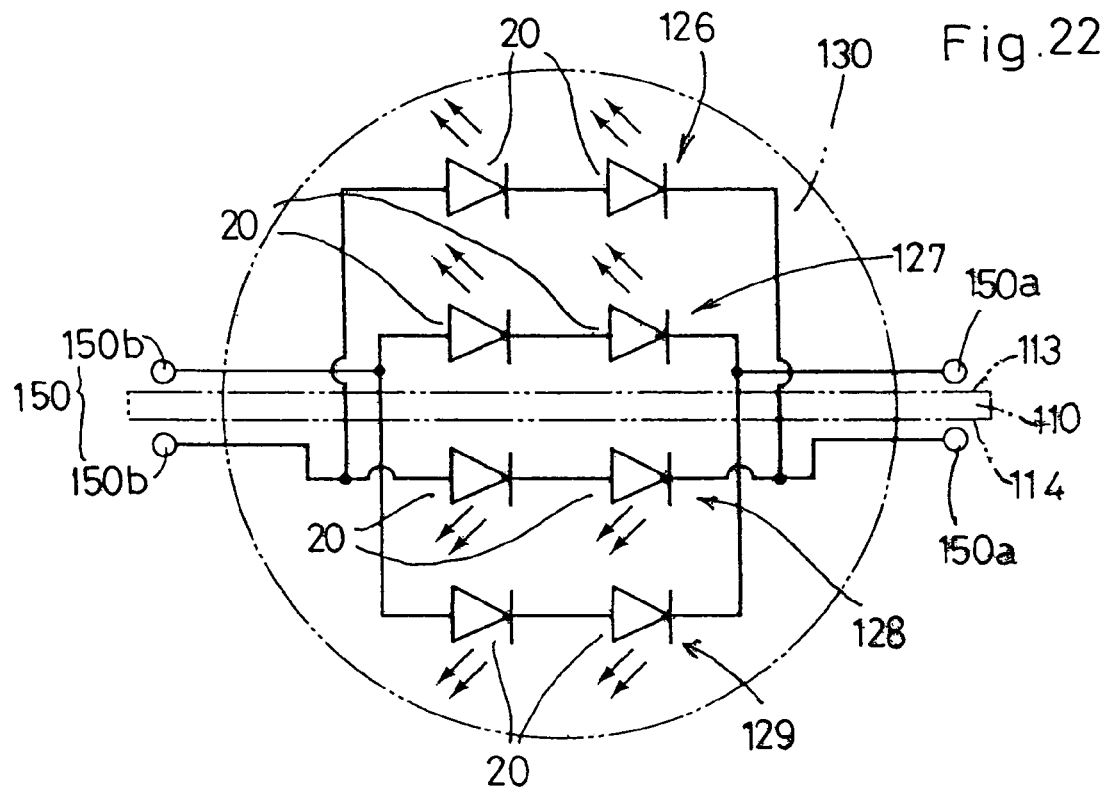
FIG. 22 is a circuit diagram of the light-emitting unit of the second embodiment.

Then, as shown in FIG. 16, four packaged light-emitting elements 20 are mounted on the obverse surface 113 of the substrate 110. As seen from the figure, the upper two elements 20 are connected in series by the upper intermediate conductor 141c, thereby providing a "first element set 126." Likewise, the lower two elements 20 are connected in series by the lower intermediate conductor 141c, thereby providing a "second element set 127." The first element set 126 is connected at one end to the upper left anode 150a and at the other end to the upper right cathode 150b. The second element set 127 is connected at one end to the lower left anode 150a and at the other end to the lower right cathode 150b. Arrangements identical to those shown in FIG. 16 are also built on the other side (i.e., the reverse surface 114) of the substrate 110. As shown in FIG. 22, a first element set 128 consisting of two light-emitting elements 20 is connected between one anode 150a and one cathode 150b, while a second element set 129 consisting of another two light-emitting elements 20 is connected between the other anode 150a and the other cathode 150b.

Then, a liquid resin material for making the lens 130 is dropped into the circular opening of the light-shielding layer 170, so that a dome of liquid resin is produced. After the desired lens configuration is obtained with the appropriate resin supply, the supplied resin is hardened. The same lens fabrication process is performed with respect to the other side of the substrate, which completes the light-emitting unit 101 shown in FIG. 14.

According to the second embodiment described above, the lens 130 is disposed at the center of the rectangular substrate 110, and the periphery 131 of the lens 130 is spaced from the longer sides 117 by a small distance ΔL (see FIG. 14A). With such an arrangement, the light-emitting unit 101 can serve as a substantially spherical light source, as viewed in the elevation of FIG. 14B which reveals, among other things, the longer side surface 117 of the substrate 110. The light-emitting unit 101 of the second embodiment can be connected in series to one or more identical light-emitting units in the longitudinal direction of the units. In this manner, a complex illuminator having a chain of spherical light sources is produced.

According to the second embodiment, referring to FIG. 22, the first element set 126 and the second element set 127 on the obverse surface 113 of the substrate 110 are powered by different current paths which are electrically independent of each other. Likewise, on the reverse side of the substrate 113, the first and the second element sets 128 and 129 are independently powered. Meanwhile, the obverse-side first element set 126 and the reverse-side first element set 128 are connected in parallel, and the obverse-side second element set 127 and the reverse-side second element set 129 are connected in parallel. With such an arrangement, the light-emitting unit 101 has two illumination modes available: a single illumination mode in which only one element set on each side of the substrate 110 is energized (hence two element sets in total are energized), and a twin illumination mode in which the two element sets on each side of the substrate 110 are energized (hence all the four element sets are energized). This feature is advantageous for the user to make adjustment of the brightness of illumination.

In the above embodiment, four light-emitting elements 20 on each side are electrically divided into two equal groups (i.e., each group contains two elements 20). The present invention, however, is not limited to this. For instance, the four light-emitting elements 20 may be divided into two unequal groups, one group ("the first group" below) containing only one element 20 and the other group ("the second group" below) containing three elements 20 (connected in series or parallel). With this arrangement, the light-emitting unit can have three illumination modes: a first mode in which only the first group is energized (low level), a second mode in which only the second group is energized (intermediate level), and a third mode in which both the first group and the second group are energized (high level).

Figure 23:
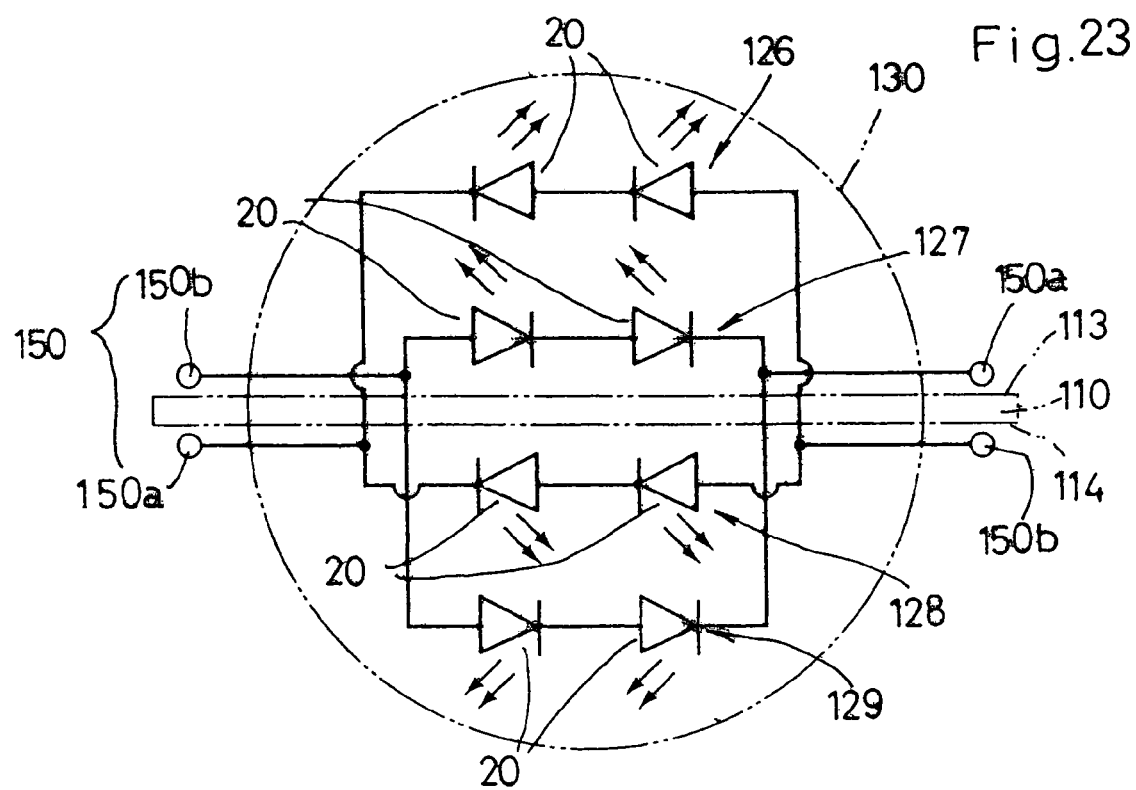
FIG. 23 is a circuit diagram of a modified light-emitting unit of the second embodiment.

According to the present invention, the circuit shown in FIG. 23 may be employed in place of the circuit shown in FIG. 22. Specifically, in the circuit of FIG. 23, the first element set 126 and the second element set 127 on the obverse surface 113 have the opposite polarities, and likewise the first element set 128 and the second element set 129 on the reverse surface 114 have the opposite polarities. Further, the obverse-side first element set 126 and the reverse-side first element set 128 are connected in parallel, while the obverse-side second element set 127 and the reverse-side second element set 129 are also connected in parallel. With this arrangement, the first element sets 126, 128 and the second element sets 127, 129 can be alternately turned on and off with the application of an alternating current.

Figure 24:
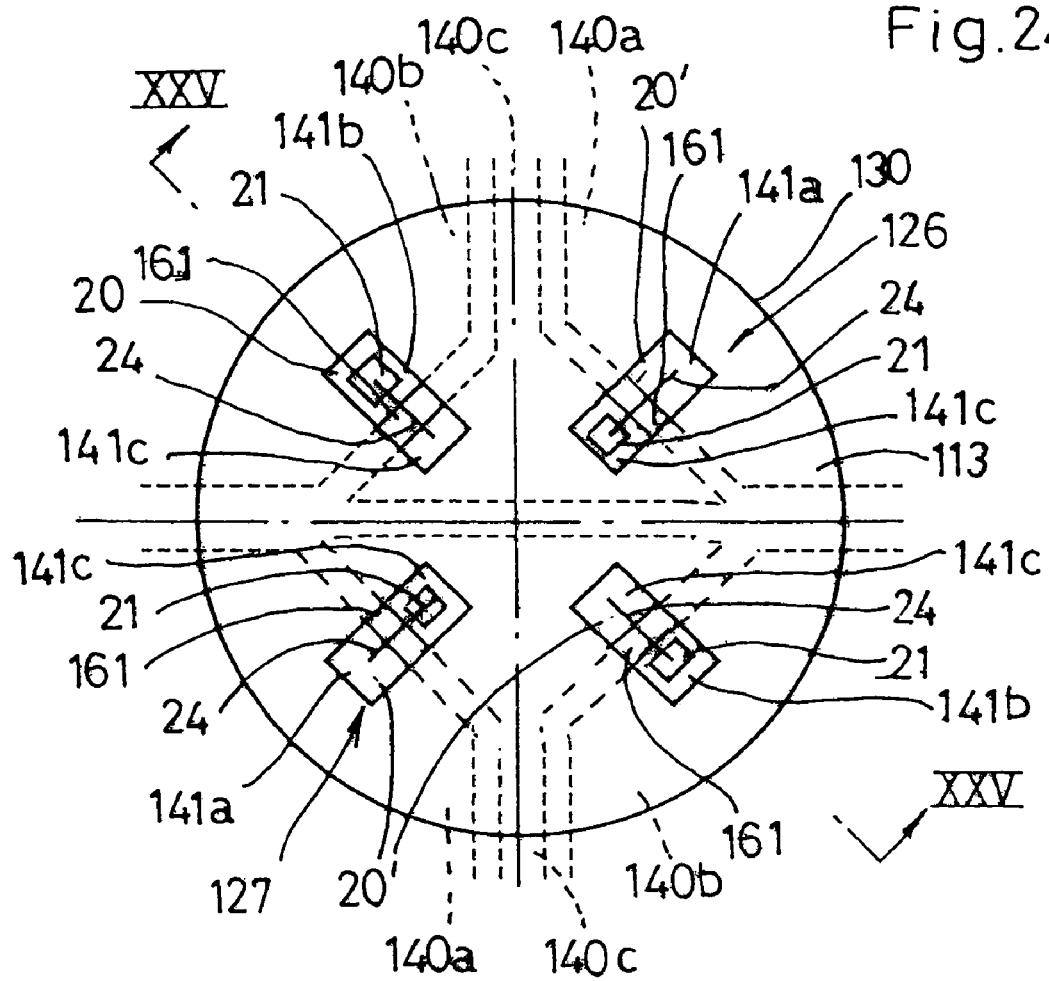
FIG. 24 is a front view showing four bare LED chips mounted on a wiring pattern, as a modified version of the second embodiment.
Figure 25:
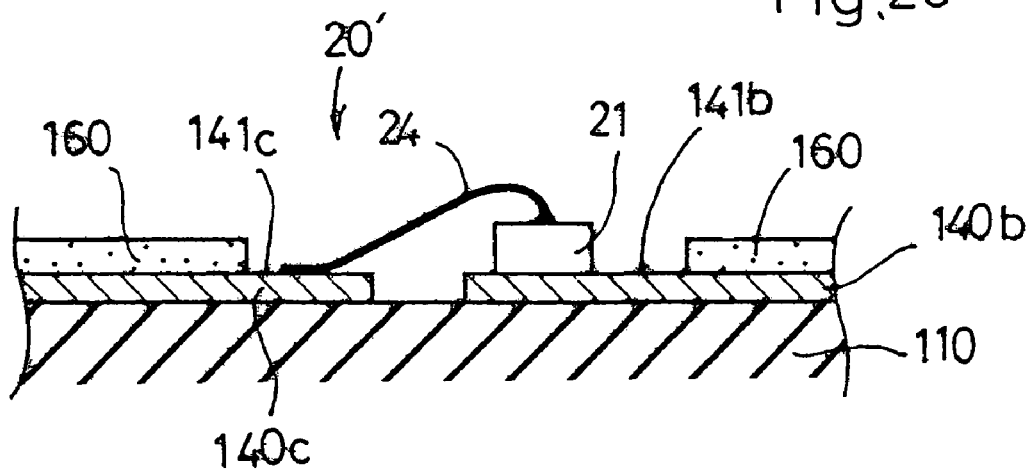
FIG. 25 is a partial sectional view taken along lines XXV—XXV in FIG. 24.

In the second embodiment described above, use is made of packaged light-emitting elements, though the present invention is not limited to this. Specifically, as shown in FIGS. 24 and 25, a non-packaged light-emitting element 20' may be employed in place of a packaged element 20. In this case, a light-emitting diode chip 21 is directly mounted on a wiring pattern 140 with the use of a wire 24 for the required connection. The layout of the light-emitting elements 20' shown in FIG. 24 corresponds to the circuit diagram of FIG. 23. Thus, the first element set 126 and second element set 127 on the obverse surface 113 are opposite in polarity. The same circuit is built on the reverse surface 114 of the substrate 110, with the polarities of the first element set 128 and the second element set 129 being opposite. In the illustrated example shown in FIG. 24, each wire 24 is arranged to extend along an imaginary straight line (not shown) extending through the center of the lens 130, so that the wires 24 of the respective light-emitting elements 20 radially extend, as viewed in plan view.

In the embodiment of FIG. 14A, the periphery 131 of the lens 130 is located adjacent to two sides (the longer sides 117) of the substrate 110. According to the present invention, however, the periphery 131 of the lens 130 may be adjacent to only one of the four sides of the rectangular substrate 110.

Figure 26:
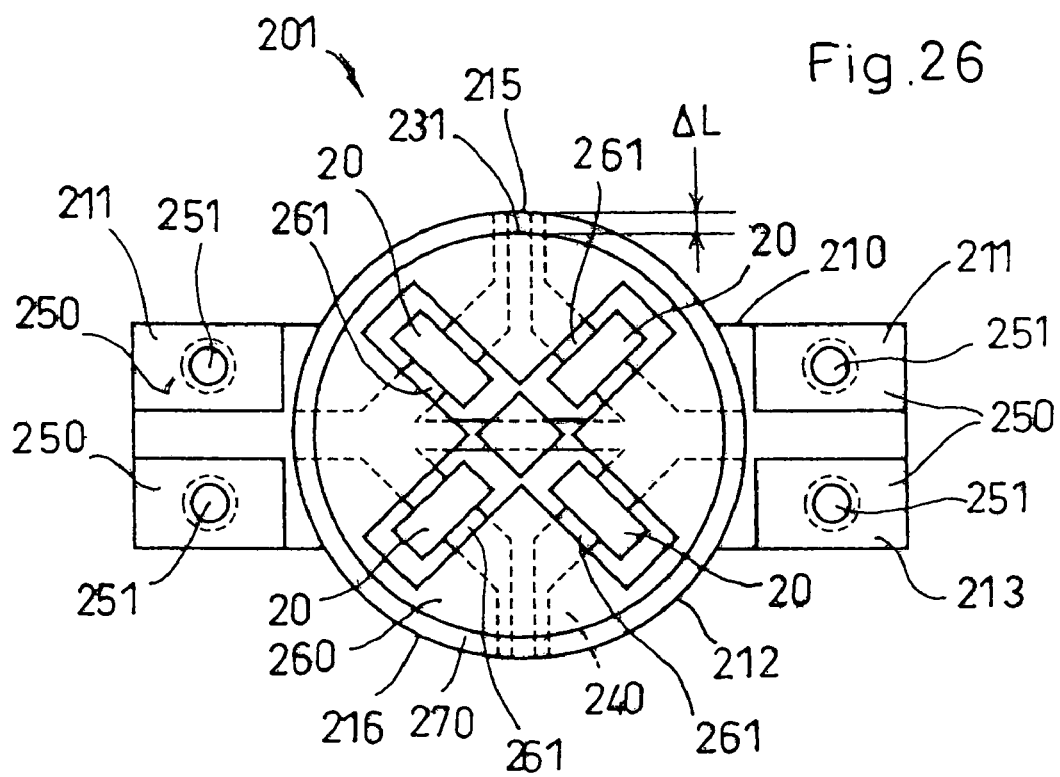
FIG. 26 is a front view showing a light-emitting unit according to a third embodiment of the present invention, with the lens removed.

Reference is now made to FIG. 26 illustrating a light-emitting unit 201 according to a third embodiment of the present invention. The unit 201 is a modified version of the unit 101 of the second embodiment (see FIG. 16).

Specifically, the unit 201 includes a transparent substrate 210 which is a non-rectangular plate as a whole. As seen from FIG. 26, the substrate 210 of the third embodiment includes a circular center portion 212 and two rectangular end portions 211 both of which extend oppositely from the center portion 212. Each end portion 211 is provided with connection terminals (anode or cathode) 250.

The substrate 210 has an obverse surface 213 provided with a wiring pattern 240 consisting of six separate parts. The wiring pattern 240 is connected to the above-mentioned terminals 250. On the reverse side of the substrate 210, the same connection terminals (which may also be referred to by numeral 250) are formed to be connected to the obverse-surface terminals 250 by through-holes 251. Four packaged light-emitting elements 20 are mounted on the circular portion 212 in a radially extending manner as in the case shown in FIG. 16. Though not shown, the four elements 20 are enclosed by a lens. Corresponding in position and configuration to the circular bottom of the non-illustrated lens, a reflector 260 is formed on the substrate 210. The reflector 260 has some openings in which the substrate 210 is partially exposed (see reference numeral 261). With such an arrangement, the light emitted from the elements 20 can enter the inside of the substrate 210, propagate through it, and go out via the side surface 216. Surrounding the lens, a black light-shielding layer 270 is formed on a peripheral region of the circular portion 212 of the substrate 210. The shielding layer 270 has a small width ΔL, which is equal to the distance between the periphery 231 of the lens and the periphery 215 of the circular portion 212.

The light-emitting unit 201 shown in FIG. 26 has smaller connection terminals 250 than those of the unit shown in FIG. 16, whereby the light emitted from the elements 20 is blocked less by the terminals 250. This feature is advantageous for making a more beautiful ornamental illuminator by linking a number of light-emitting units 201 in series, for example.

Figure 27:
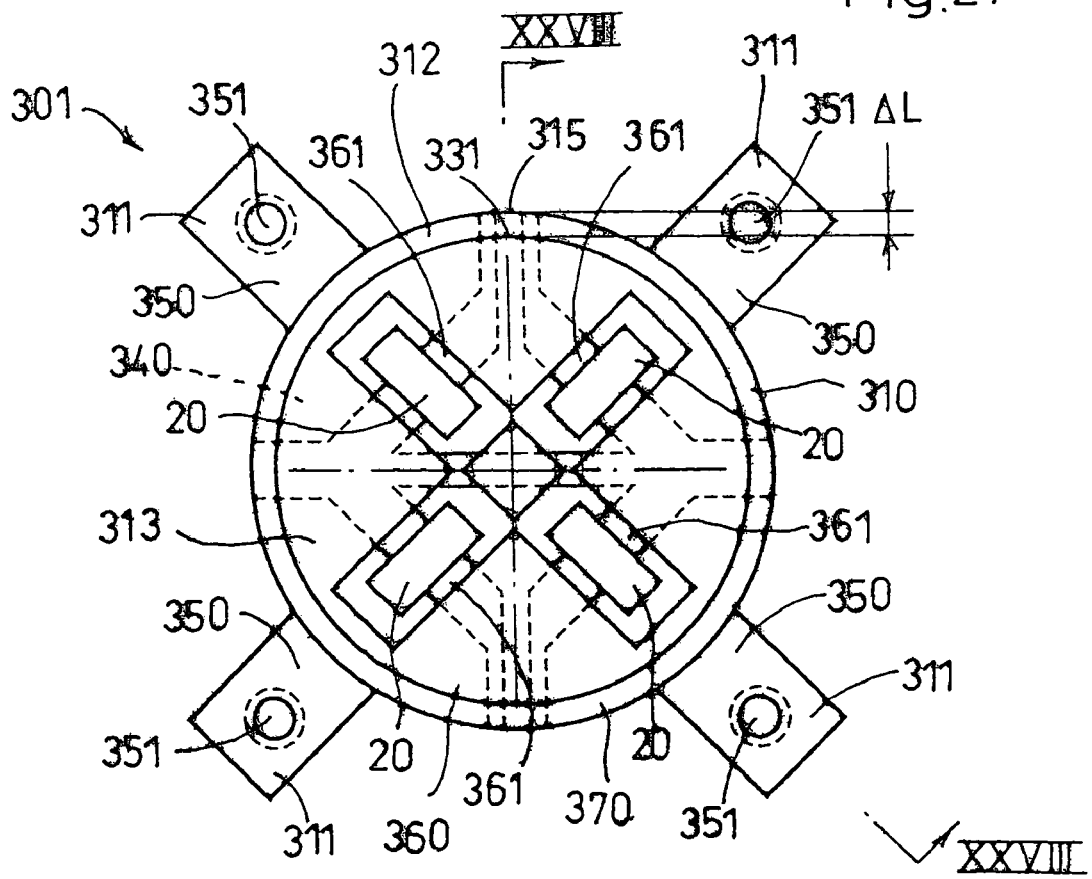
FIG. 27 is a front view showing a light-emitting unit according to a fourth embodiment of the present invention, with the lens removed.
Figure 28:
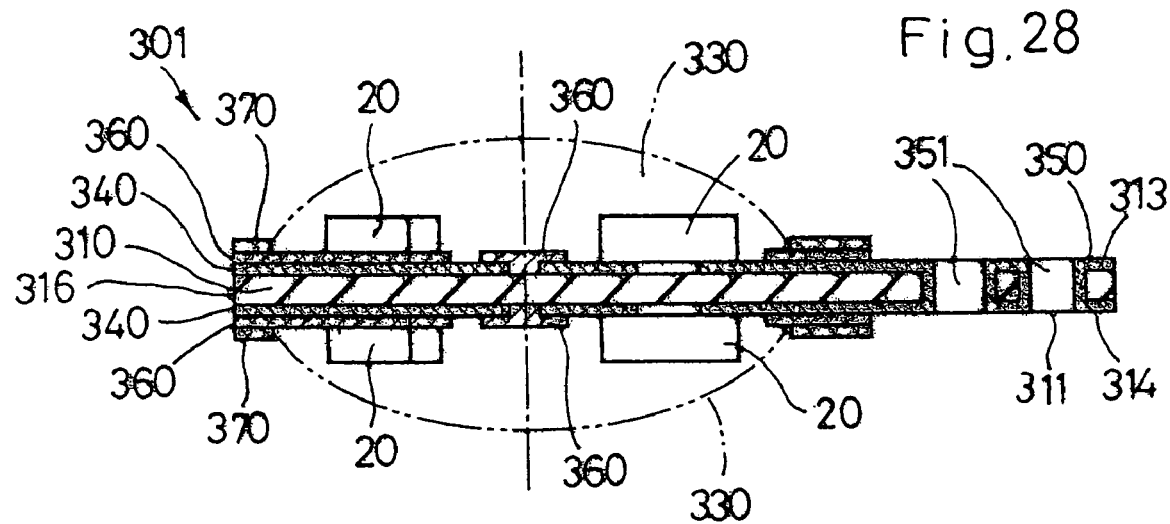
FIG. 28 is a sectional view taken along lines XXVIII—XXVIII in FIG. 27.
Figure 29:
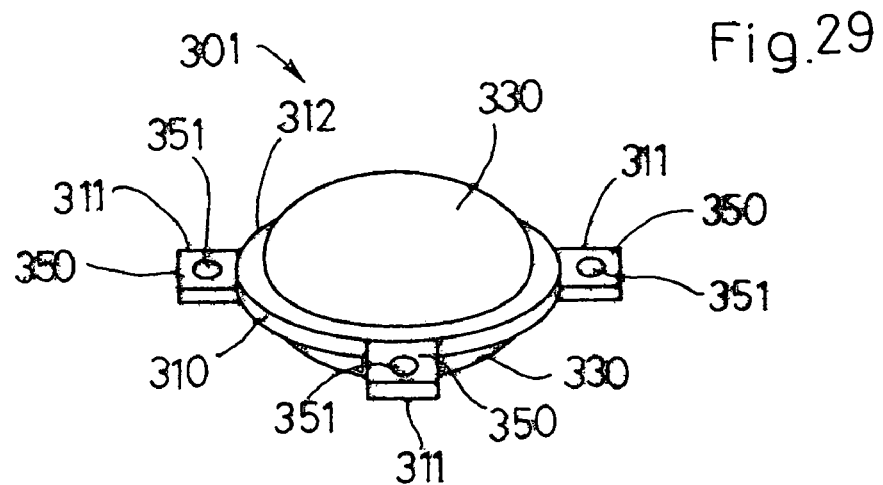
FIG. 29 is a perspective view showing the light-emitting unit of the fourth embodiment.

Reference is now made to FIGS. 27–29 illustrating a light-emitting unit according to a fourth embodiment of the present invention.

The light-emitting unit 301 of the fourth embodiment is another modified version of the unit of the second embodiment. As seen from FIG. 27, the most noticeable feature of the unit 301 is that the substrate 310 includes four rectangular portions 311 projecting radially from a circular portion 312 of the substrate. Each rectangular portion 311 is provided with a connection terminal 350. In the illustrated example, the four portions 311 are arranged at the equal intervals around the circular portion 312.

The substrate 310 has an obverse surface 313 provided with a wiring pattern 340 consisting of six conductive parts (needless to say, the same arrangements, described above or below, are provided on the reverse side of the substrate 310). The wiring pattern 340 is connected to the terminals 350. A through-hole 351 is formed in each rectangular portion 311 for connecting the obverse-surface and the reverse-surface terminals 350 to each other. Four packaged light-emitting elements 20 are mounted on the obverse side of the circular portion 312 in a radially extending manner. The elements 20 are enclosed by a lens 330 (see FIG. 28). Corresponding in position and configuration to the bottom of the lens 330, a reflector 360 is formed on the substrate 310. The reflector 360 has some openings in which the substrate 310 is partially exposed (see reference numeral 361). With such an arrangement, the light emitted from the elements 20 can enter the inside of the substrate 310, propagate through it, and go out via the side surface 316. Surrounding the lens 330, a black light-shielding layer 370 is formed on a peripheral region of the circular portion 312 of the substrate 310. The shielding layer 370 has a small width ΔL, which is equal to the distance between the periphery 331 of the lens 330 and the periphery 315 of the circular portion 312.

According to the fourth embodiment, each rectangular portion 311 is provided with only one terminal 350 (anode or cathode), which differs from the arrangement of the third embodiment shown in FIG. 26 (each rectangular portion 211 carries two terminals 250). With this arrangement, each rectangular portion 311 can be made smaller than the rectangular portion 211 of the third embodiment. Further, since the four rectangular portions 311 project in four different directions with the equal circumferential distance in the same plane, a composite illuminator obtained by connecting a number of light-emitting units 301 can be expanded two-dimensionally.

Figure 30:
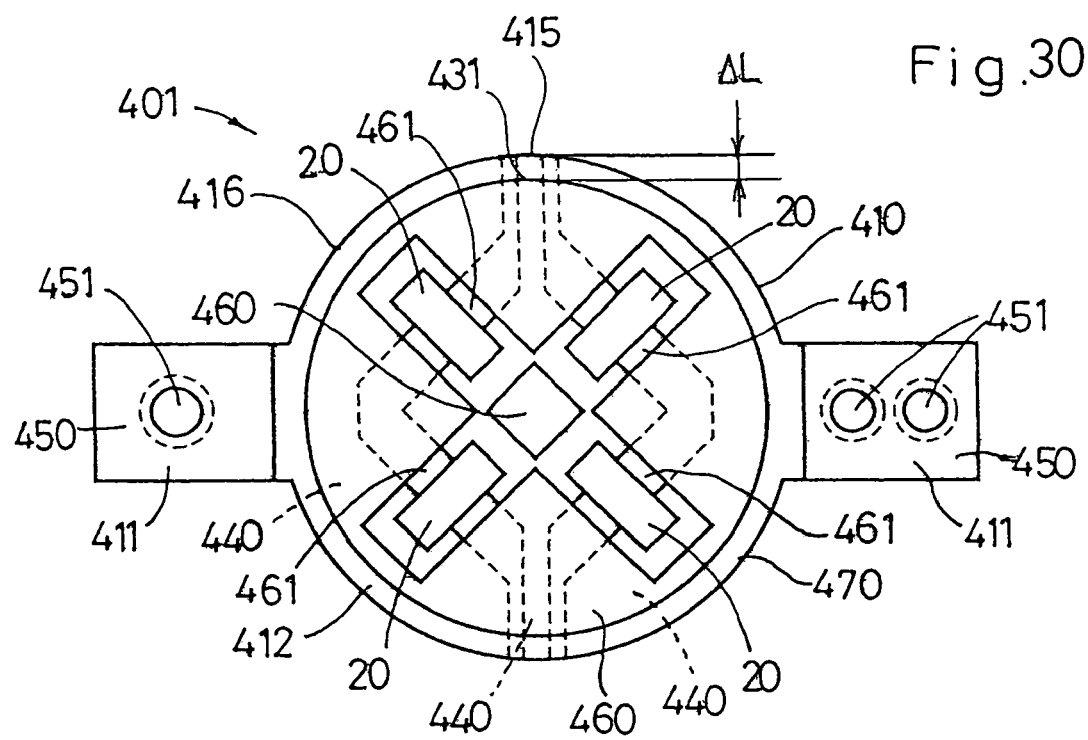
FIG. 30 is a front view showing a light-emitting unit according to a fifth embodiment of the present invention, with the lens removed.
Figure 31:
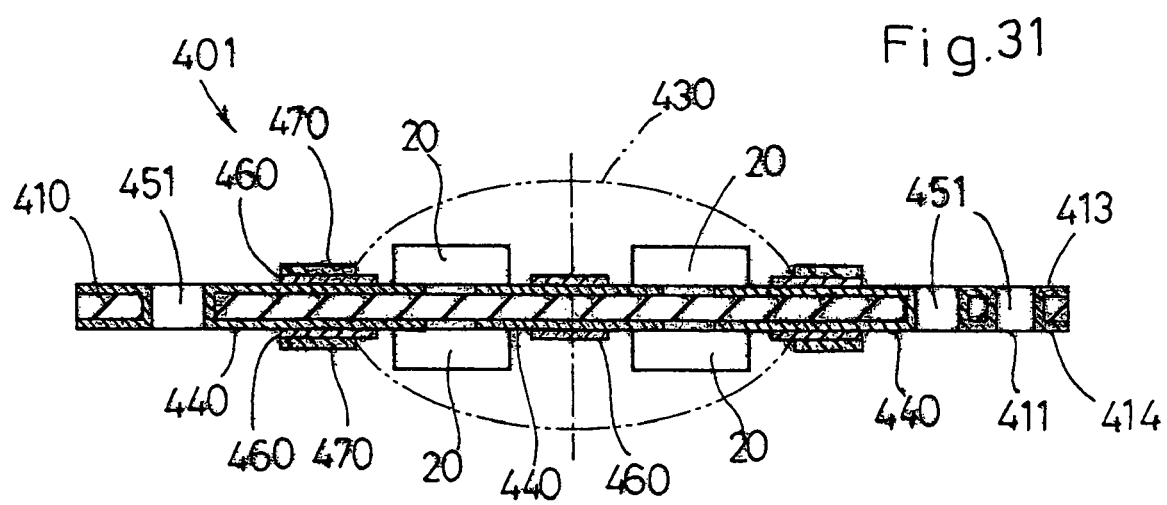
FIG. 31 is a sectional view showing the light-emitting unit of the fifth embodiment.
Figure 32:
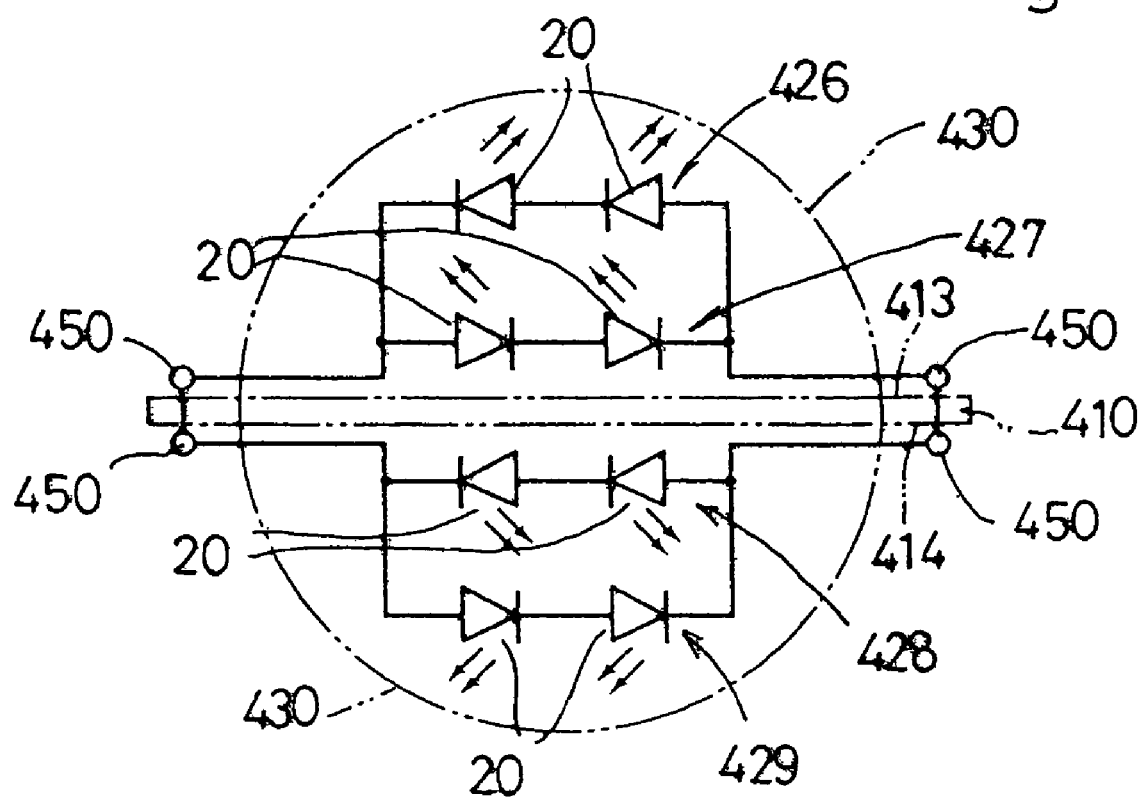
FIG. 32 is a circuit diagram of the light-emitting uit of the fifth embodiment.

Reference is now made to FIGS. 30–32 illustrating a light-emitting unit according to a fifth embodiment of the present invention.

The illustrated light-emitting unit 401 of the fifth embodiment includes eight light-emitting elements 20 grouped into four equal element sets 426–429 (each set contains two light-emitting elements 20 connected in series). The first and the second element sets 426, 427 are mounted on the obverse surface 413 of a substrate 410, while the third and the fourth element sets 428, 429 are mounted on the reverse surface 414 of the substrate 410. On the obverse side, the first element set 426 and the second element set 427 have the opposite polarities. Likewise, on the reverse side, the third element set 428 and the fourth element set 429 have the opposite polarities. As seen from FIG. 32, those four element sets are energized by the same driving circuit.

As shown in FIG. 30, the substrate 410 includes a circular portion 412 and two rectangular portions 411 projecting oppositely from the circular portion 412. Each rectangular portion 411 is provided with a pair of connection terminals 450 on the obverse and the reverse sides of the substrate 410. These two terminals 450 are connected to each other by a through-hole 451 formed in the rectangular portion 411. In the illustrated example, for enabling polarity distinction, two through-holes 451 are formed in the right rectangular portion 411, while only one through-hole 451 is formed in the left rectangular portion 411.

A wiring pattern 440 is formed on the obverse surface 413 (likewise, on the reverse surface 414) of the substrate 410, to be connected to the connection terminal 450. The wiring pattern 440 consists of three conductive parts, i.e., an intermediate part and two side parts flanking the intermediate part, as represented in broken lines in FIG. 30. The right and the left side parts of the pattern 440 are connected to the right and the left connection terminals 450, respectively. On each side of the substrate 410, four packaged light-emitting elements 20 are mounted on the circular portion 412 in a radially extending manner. The elements 20 are enclosed by a lens 430. Corresponding an position and configuration to the bottom of the lens 430, a reflector 460 is formed on the circular portion 412. The reflector 460 has some openings in which the substrate 410 is partially exposed (see reference numeral 461). With this arrangement, the light emitted from the light-emitting elements 20 can enter the inside of the substrate 410, propagate through it, and go out from the side surface 416. Surrounding the lens 430, a black light-shielding layer 470 is formed on the circular portion 412 of the substrate 410. The shielding layer 470 has a small width ΔL, which is equal to the distance between the periphery 431 of the lens 430 and the periphery 415 of the circular portion 412 of the substrate.

Upon application of an alternating current, the element sets 426, 428 are turned on and off alternately with the element sets 427, 429, as understood from the circuit diagram of FIG. 32.

According to the present invention, the light emitted from the light-emitting elements 20 mounted on each side of the substrate is appropriately dispersed within the lens containing light-dispersing particles. With this arrangement, the light-emitting unit of the present invention can serve as a spherical light source by the combination of two hemispheres of light, one resulting from the light-emitting elements mounted on the obverse side of the substrate, the other resulting from the light-emitting elements mounted on the reverse side of the substrate. For providing a more complete spherical configuration of light, the lens enclosing the light-emitting elements has a periphery disposed adjacent to the edge of the substrate, so that the emitted light undergoes substantially no interference with the edge of the substrate.

Further, with the use of a reflector disposed adjacent to the bottom of the lens, the light-emitting unit of the present invention makes an illuminator of bright light.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A light-emitting unit comprising:
a substrate including an obverse surface and a reverse surface;
a first light-emitting element mounted on the obverse surface of the substrate, and a second light-emitting element mounted on the reverse surface of the substrate;
a first lens arranged for dispersion of light and enclosing the first light-emitting element, and a second lens arranged for dispersion of light and enclosing the second light-emitting element;
a first wiring pattern formed on the obverse surface of the substrate, and a second wiring pattern formed on the reverse surface of the substrate; and
a reflecting layer arranged between each lens and a corresponding one of the first and second wiring patterns;
wherein each lens includes a periphery which is adjacent to at least a part of an edge of the substrate; and
wherein the reflecting layer is formed with an opening in which said corresponding one of the first and second wiring patterns is partially exposed.

2. The unit according to claim 1, wherein the periphery of each lens is circular, the edge of the substrate including an arcuate portion extending along the circular periphery of said each lens.

3. The unit according to claim 1, wherein the dispersion of light for each lens is provided by causing said each lens to contain light-dispersing particles.

4. The unit according to claim 1, wherein the substrate is made of a transparent material.

5. The unit according to claim 1, wherein the substrate has a rectangular configuration including a first end and a second end which are spaced apart from each other, the first end being provided with a first terminal, the second end being provided with a second terminal, and wherein each light-emitting element and each lens are disposed in a central region of the substrate between the first terminal and the second terminal.

6. The unit according to claim 1, further comprising an additional light-emitting element mounted on the obverse surface of the substrate and enclosed by the first lens, wherein the first light-emitting element and the additional light-emitting element are energized through different current paths independent of each other.

7. The unit according to claim 6, wherein the first light-emitting element arid the additional light-emitting element are connected with opposite polarities.

8. The unit according to claim 1, further comprising a black layer covering only a part of the substrate around the periphery of the lens alone the edge of the substrate.

9. The unit according to claim 1, wherein each light-emitting element includes a supporting base, a light-emitting diode chip mounted on the base, and a transparent resin member enclosing the chip.

10. The unit according to claim 9, wherein the base has an elongated rectangular configuration and a center line that extends longitudinally of the base, the center line passing through a center of the lens.

11. The unit according to claim 1, wherein each light-emitting element includes a light-emitting diode chip diebonded to a corresponding one of the wiring patterns, and a metal wire connected to the chip.

12. The unit according to claim 11, wherein the metal wire is arranged to extend along a straight line passing through a center of the lens.

13. An illuminator comprising:
a substrate including an obverse surface and a reverse surface;
a first light-emitting element mounted on the obverse surface of the substrate, and a second light-emitting element mounted on the reverse surface of the substrate;
a first lens arranged for dispersion of light and enclosing the first light-emitting element, and a second lens arranged for dispersion of light and enclosing the second light-emitting clement;
a first wiring pattern formed on the obverse surface of the substrate, and a second wiring pattern formed on the reverse surface of the substrate;
a base connected to the wiring patterns; and
an envelope for accommodating the substrate, the light-emitting elements, the lenses and the wiring patterns;
wherein each lens includes a periphery which is adjacent to at least a part of an edge of the substrate.

14. The illuminator according to claim 13, wherein the periphery of each lens is circular, the edge of the substrate including an arcuate portion extending along the circular periphery of said each lens.

15. The illuminator according to claim 13, further comprising an additional light-emitting element mounted on the obverse surface of the substrate and enclosed by the first lens, wherein the first light-emitting element and the additional light-emitting element are energized through different current paths independent of each other.

16. The illuminator according to claim 15, wherein the first light-emitting element and the additional light-emitting element are connected with opposite polarities.

17. The illuminator according to claim 13, further comprising a black layer covering at least part of the substrate between the periphery of the lens and the edge of the substrate.

18. The illuminator according to claim 13, wherein each light-emitting element includes a supporting base, a light-emitting diode chip mounted on the supporting base, and a transparent resin member enclosing the chip.

19. The illuminator according to claim 18, wherein the supporting base has an elongated rectangular configuration and a center line that extends longitudinally of the supporting base, the center line passing through a center of the lens.

20. The illuminator according to claim 13, wherein each light-emitting element includes a light-emitting diode chip diebonded to a corresponding one of the wiring patterns, and a metal wire connected to the chip.

21. A light-emitting unit comprising:
a substrate including an obverse surface and a reverse surface;
a first light-emitting element mounted on the obverse surface of the substrate, and a second light-emitting element mounted on the reverse surface of the substrate;
a first lens arranged for dispersion of light and enclosing the first light-emitting element, and a second lens arranged for dispersion of light and enclosing the second light-emitting element; and
a first wiring pattern formed on the obverse surface of the substrate, and a second wiring pattern formed on the reverse surface of the substrate;
wherein each lens includes a periphery which is adjacent to at least a part of an edge of the substrate;
wherein the light-emitting unit further comprises an additional light-emitting element mounted on the obverse surface of the substrate and enclosed by the first lens; and
wherein the first light-emitting element and the additional light-emitting element arc energized through different current paths independent of each other.

22. the unit according to claim 21, wherein the first light-emitting element and the additional light-emitting element are connected with opposite polarities.

* * * * *